United States Patent [19]

Shimizu et al.

[11] Patent Number: 5,626,679
[45] Date of Patent: May 6, 1997

[54] METHOD AND APPARATUS FOR PREPARING A SILICON OXIDE FILM

[75] Inventors: Akio Shimizu; Naoto Tsuji, both of Kawasaki, Japan

[73] Assignee: Fuji Electric Co., Ltd., Kawasaki, Japan

[21] Appl. No.: 378,320

[22] Filed: Jan. 25, 1995

Related U.S. Application Data

[63] Continuation of Ser. No. 937,552, Aug. 31, 1992, abandoned.

[30] Foreign Application Priority Data

Sep. 2, 1991 [JP] Japan .................. 3-220810
Jan. 16, 1992 [JP] Japan .................. 4-005249

[51] Int. Cl.$^6$ ........................................ C23C 16/00
[52] U.S. Cl. ........................ 118/723 MR; 118/723 MP
[58] Field of Search ............................ 118/723 MW, 118/723 ME, 723 MR, 723 E, 723 MP; 204/298.38; 156/345

[56] References Cited

U.S. PATENT DOCUMENTS

| | | | |
|---|---|---|---|
| 4,115,184 | 9/1978 | Poulsen ................ | 156/643 X |
| 4,461,237 | 7/1984 | Hinkel et al. ........... | 118/50.1 |
| 4,492,620 | 1/1985 | Matsuo et al. .......... | 118/723 X |
| 4,728,869 | 3/1988 | Johnson et al. .......... | 318/335 |
| 4,760,008 | 7/1988 | Yamazaki et al. ........ | 430/217 |
| 4,761,269 | 8/1988 | Conger et al. .......... | 118/715 X |
| 4,795,529 | 1/1989 | Kawasaki et al. ........ | 156/643 |
| 4,826,585 | 5/1989 | Davis ................. | 118/723 X |
| 4,831,963 | 5/1989 | Saito et al. ........... | 118/723 |
| 4,838,990 | 6/1989 | Jucha et al. ........... | 156/643 |
| 4,876,983 | 10/1989 | Fukuda et al. .......... | 118/722 |
| 4,897,284 | 1/1990 | Arai et al. ............ | 118/723 MR X |
| 4,902,934 | 2/1990 | Miyamura et al. ........ | 315/111.21 |
| 4,921,724 | 5/1990 | Hubert et al. . | |
| 4,935,303 | 6/1990 | Ikoma et al. ........... | 428/408 |

(List continued on next page.)

FOREIGN PATENT DOCUMENTS

| | | |
|---|---|---|
| 0047663 | 3/1982 | European Pat. Off. . |
| 0049588 | 4/1982 | European Pat. Off. . |
| 154078 | 9/1985 | European Pat. Off. . |
| 0209109 | 1/1987 | European Pat. Off. . |
| 0260718 | 3/1988 | European Pat. Off. . |
| 0326405 | 8/1989 | European Pat. Off. . |
| 0346018 | 12/1989 | European Pat. Off. . |

(List continued on next page.)

OTHER PUBLICATIONS

Sugano, *Applications of Plasma Processes to VLSI Technology*, 1985, pp. 191–197.
*Patent Abstracts of Japan*, C–564, Jan. 30, 1989, vol. 13 No. 42 (JP 63–241181A).
*Patent Abstracts of Japan*, C–593, May 8, 1989, vol. 13, No. 190 (JP 1–17869A).

(List continued on next page.)

*Primary Examiner*—R. Bruce Breneman
*Assistant Examiner*—Toni Y. Chang
*Attorney, Agent, or Firm*—Spencer & Frank

[57] ABSTRACT

An ECR plasma CVD apparatus is used for forming a silicon oxide film on a semiconductor substrate. The gas pressure inside the apparatus is set within the range of $7 \times 10^{-3}$ to $1 \times 10^{-1}$ Torr and high frequency power is applied to the substrate. A cusp-shaped magnetic field is created. Due to a synergistic effect between the high frequency electric field and the cusp-shaped magnetic field, the film has an improved waterproofing property. The gas pressure inside the apparatus is controlled by controlling the cross sectional area of a bypassing conduit connected to an exhaust pipe, by introducing gas into the exhaust pipe in a central portion thereof, or by controlling the rotational speed of a vacuum pump. A subsolenoid is arranged such that the end of the subsolenoid that is nearest the substrate is disposed at a distance of 10 cm or more from the substrate, so that a cusp-shaped magnetic field can be created with a cusp plane positioned at a distance of 10 cm or less from the substrate on either side thereof.

26 Claims, 21 Drawing Sheets

U.S. PATENT DOCUMENTS

| | | | |
|---|---|---|---|
| 4,953,498 | 9/1990 | Hashizume et al. | 118/723 X |
| 4,971,651 | 11/1990 | Watanabe et al. | 156/643 |
| 4,973,494 | 11/1990 | Yamazaki | 118/723 X |
| 4,996,077 | 2/1991 | Moslehi et al. | 156/643 X |
| 5,013,579 | 5/1991 | Yamazaki . | |
| 5,019,117 | 5/1991 | Nakamura et al. | 118/723 |
| 5,024,716 | 6/1991 | Sato | 156/345 |
| 5,045,346 | 9/1991 | Tabasky et al. . | |
| 5,053,244 | 10/1991 | Kieser et al. . | |
| 5,181,986 | 1/1993 | Ohiwa | 118/723 MR X |
| 5,200,232 | 4/1993 | Tappan et al. | 118/719 X |
| 5,211,825 | 5/1993 | Saito et al. | 204/192.32 |
| 5,234,526 | 8/1993 | Chen et al. | 156/345 |

FOREIGN PATENT DOCUMENTS

| | | | |
|---|---|---|---|
| 0403418 | 12/1990 | European Pat. Off. . | |
| 0407169 | 1/1991 | European Pat. Off. . | |
| 0470580 | 2/1992 | European Pat. Off. . | |
| 0477906 | 4/1992 | European Pat. Off. . | |
| 3322680C2 | 1/1984 | Germany . | |
| 3609681A1 | 10/1986 | Germany . | |
| 4110632A1 | 10/1991 | Germany . | |
| 1-222437 | 9/1989 | Japan . | |
| 1-313941 | 12/1989 | Japan . | |
| 2-50429 | 2/1990 | Japan . | |
| 2-250976 | 10/1990 | Japan | 118/723 MR |
| 3-14223 | 1/1991 | Japan . | |
| 3-263324 | 11/1991 | Japan . | |
| 2076587A | 12/1981 | United Kingdom . | |
| 2154365 | 9/1985 | United Kingdom . | |
| 2155862 | 10/1985 | United Kingdom . | |
| 2173822 | 10/1986 | United Kingdom . | |
| 2172822 | 10/1986 | United Kingdom . | |
| 2244371 | 11/1991 | United Kingdom . | |
| 2243944 | 11/1991 | United Kingdom . | |
| WO92/10308 | 6/1992 | WIPO . | |

OTHER PUBLICATIONS

*Patent Abstracts of Japan*, C–670, Dec. 25, 1989, vol. 13, No. 589 (JP 1–246367A).

*Patent Abstracts of Japan*, C–755, Sep. 6, 1990, vol. 14, No. 412 (JP 2–156088).

*Patent Abstracts of Japan*, C–767, Oct. 4, 1990, vol. 14, No. 459 (JP 2–185979A).

*Patent Abstracts of Japan*, C–791, Dec. 21, 1990, vol. 14, No. 578 (JP 2–250976A).

*Patent Abstracts of Japan*, C–816, Mar. 26, 1991, vol. 15, No. 123 (JP 3–6381A).

*Patent Abstracts of Japan*, C–828, May 2, 1991, vol. 15, No. 173 (JP 3–39480A).

Herak, T.V., et al., Low–temperature deposition of silicon dioxide films from electron cyclotron resonant microwave plasmas, *J. Appln. Phys.*, vol. 65, No. 6, Mar. 1989, pp. 2547–2463.

Martinu, L., et al., Dual–mode microwave/radio frequency plasma deposition of dielectric thin films, *Appl. Phys. Lett.*, vol. 54, No. 26, 1989, pp. 2645–2547.

Partlow, W.D., et al., Dependence of Plasma–Assisted BPSG Deposition on Substrate Properties, *J. Electrochem. Soc., Solid State Science and Technology*, vol. 134, No. 7, Jul. 1987, pp. 1740–1743.

*Patent Abstracts of Japan*, E–923, May 7, 1990, vol. 14, No. 213 (JP 2–50429—See AE above).

*Patent Abstracts of Japan*, E–898, Mar. 5, 1990, vol. 14, No. 117 (JP 1–313941 —See AF above).

*Patent Abstracts of Japan*, C–564, Jan. 30, 1989, vol. 13, No. 42 (JP 63–241182A).

MAXIMUM FILM THICKNESS : 5131 Å
MINIMUM FILM THICKNESS : 4758 Å
AVERAGE FILM THICKNESS : 5009.37 Å
FILM FORMATION TIME    : 5 min
GROWTH RATE            : 1001.87 [Å/min]
DISTRIBUTION           : 3.8 %

MAXIMUM FILM THICKNESS : 5070Å
MINIMUM FILM THICKNESS : 3687Å
AVERAGE FILM THICKNESS : 4647.99Å
FILM FORMATION TIME : 5 min
GROWTH RATE : 929.599 [Å/min]
DISTRIBUTION : 15.8 %

METHOD AND APPARATUS FOR PREPARING A SILICON OXIDE FILM

This application is a Continuation, of application Ser. No. 07/937,552, Filed Aug. 31, 1992 (now abandoned).

BACKGROUND OF THE INVENTION

1. Field of the Invention

The present invention relates to a process and apparatus for preparing a silicon oxide film, and more particularly to a method for preparing a silicon oxide film using an ECR plasma CVD apparatus comprising a plasma generation chamber which receives microwaves and a plasma raw material, an exciting solenoid which surrounds the plasma generation chamber concentrically and forms therein an electron cyclotron resonance magnetic field together with the microwaves, a plasma reaction chamber or processing chamber which receives a reactive gas and which communicates with the plasma generation chamber, and a substrate or specimen holder inside the plasma reaction chamber for holding a substrate in such a manner that a surface on which a film is to be grown faces the plasma generation chamber. The invention also relates to such an ECR plasma CVD apparatus, particularly for preparing a silicon oxide film.

2. Description of the Prior Art

Silicon oxide films, which are prepared mostly as interlayer insulator films in the process of fabricating semiconductor devices, are required to have various characteristics, such as film-forming properties at low temperatures, low internal stresses, low etching rates, good film thickness distributions, good step coverage, excellent waterproofing properties, etc.

Electron cyclotron resonance plasma CVD (hereafter, referred to as "ECR plasma CVD") has been proposed as a film-forming process which satisfies the aforementioned conditions. FIG. 1 is a schematic cross-sectional view showing the basic arrangement of a conventional ECR plasma CVD apparatus in accordance with the process.

As shown in FIG. 1, a conventional ECR plasma CVD apparatus 100 comprises a microwave generator 102 which is connected through a waveguide 104 to a plasma generation chamber 106 for generating plasma. The plasma generation chamber 106 has a first gas supply pipe 108 and a vacuum window (waveguide window) 110. Window 110 is disposed between the waveguide 104 and the plasma generation chamber 106 and gas-tightly separates the waveguide 104 (which is under atmospheric pressure) and the plasma generation chamber 106. Below the plasma generation chamber 106 is a metal plate 112 having a large diameter opening (plasma take-out window) 112A. The metal plate 112 and the plasma generation chamber 106 together define a half-opened microwave resonator. An excitation solenoid 114 surrounds the outer surface of the resonator in such a manner that a magnetic field adapted to satisfy the ECR conditions is generated, whereby plasma is produced within the resonator chamber. A plasma reaction chamber (processing chamber) 116 is arranged below the plasma generation chamber 106 and the metal plate 112. Inside plasma reaction chamber 116 is a substrate holder 118 which holds thereon a substrate 120. The plasma reaction chamber 116 has a second gas supply pipe 122 and an exhaust pipe 124 on its lower portion through which the reaction chamber 116 is connected to a vacuum system (not shown). A second excitation solenoid 126 is provided in coaxial relationship with the first excitation solenoid 114 and in a position sandwiching the substrate 120 in the axial direction together with the first excitation solenoid, i.e., on the rear side of the substrate. An RF power source 128 is connected to the substrate 120 through a line 130 insulated from the wall 116A of the plasma reaction chamber 116.

In the conventional arrangement shown in FIG. 1, the microwaves propagated within the waveguide 104 are introduced into the plasma generation chamber 106 through the waveguide window 110. Furthermore a magnetic field is formed within the plasma generation chamber 106 by means of the first excitation solenoid 114, so that the gas introduced from the first gas supply pipe 108 is converted into plasma making use of the electron cyclotron resonance phenomenon. The first excitation solenoid 114 creates a magnetic field which diverges toward the plasma reaction chamber 116, which communicates with the plasma generation chamber 106 through the plasma take-out window 112A. The diverging magnetic field causes the plasma generated in the plasma generation chamber 106 to be drawn out therefrom into the plasma reaction chamber 116. This plasma flow reaches the substrate 120 mounted on the substrate holder 118 while reacting with the gas introduced from the second gas supply pipe 122, thus forming a thin film on the substrate 120. Further, the second excitation solenoid (subsolenoid) 126 is arranged in coaxial relationship with the first solenoid 114 and in a position sandwiching the substrate 120 in the axial direction between the second excitation solenoid 126 and the first excitation solenoid 114. Current is applied to the first excitation solenoid 114 and the subsolenoid 126 in such a manner that the solenoids form magnetic fields in opposite directions so that both magnetic fields diverge or spread outward abruptly in the vicinity of the substrate. This creates a so-called cusp-shaped magnetic field 132 with a cusp plane 134 at a predetermined distance from the surface of the substrate 120. This cusp-shaped magnetic field ECR plasma CVD apparatus can form thin films with a uniform film thickness distribution and is being used more and more widely.

In the conventional process for forming thin films, a high density plasma can be obtained at low pressures within the range of $10^{-3}$ to $10^{-4}$ Torr, which makes it possible to form silicon oxide films having small internal stresses and high acid resistances without heating the substrate 120.

However, the conventional process for forming thin films as described above has various problems in step coverage, film thickness distribution, uniformity in the film thicknesses in stepped portions, performing the process at lower temperatures, etc., as summarized below.

(1) Step Coverage:

The conventional process has a disadvantage in that when a cusp-shaped magnetic field is not created, step coverage is insufficient, while in the presence of a cusp-shaped magnetic field other problems occur as will be described later on. In order to overcome the disadvantage in the absence of a cusp-shaped magnetic field, it has been proposed to apply high frequency power to the substrate in the case where there is a stepped portion such as wiring on the substrate to cover the stepped portion by means of a self-biasing effect. However, at a pressure within the range of $10^{-3}$ to $10^{-4}$ Torr, the application of high frequency power to the substrate results in the formation of an overetched portion in the next step in the fabrication of an LSI since the distribution of the HF etching rate in the substrate plane is as narrow as ±20%, thus decreasing the yield of LSI chip or giving rise to LSIs with low reliabilities.

(2) Film Thickness Distribution:

In the conventional process, if a cusp-shaped magnetic field is created in the vicinity of the substrate and high frequency power is applied to the substrate in order to obtain a uniform film thickness distribution, the film thickness distribution falls within the usually required range of ±5% as shown in FIG. 2 when the substrate has a diameter of 6 inches. If the substrate has a diameter of 8 inches, however, the film thickness distribution increases so as to fall within the range of ±10% or wider. Thus, the conventional approach for making the film thickness uniform cannot cope with an increase in the size of the substrate. FIG. 2 shows the results of an improvement in the film thickness distribution obtained by the application of high frequency power in addition to the creation of a cusp-shaped magnetic field. This gives rise to an electric field due to a negative floating potential appearing on the surface of the substrate based on the difference in mobility between electrons and ions, which electric field is stronger at the peripheral portion of the substrate than in the center thereof. Even with this approach, when the cusp plane is positioned at a distance of 50 mm from the rear side of the substrate, the film thickness distribution is as wide as ±20% as a result of the combined effect produced by the cusp-shaped magnetic field and the electric field on the surface of the substrate. Though not shown in FIG. 2, a ring-shaped magnetron resonance region, having a ring diameter proportional to the distance between the cusp plane and the substrate, is formed at the front side of the substrate when the cusp plane is positioned at the front side of the substrate, and the film thickness is larger in the ring region than in other regions.

As described above, in a low pressure region where the gas pressure is as low as $10^{-3}$ to $10^{-4}$ Torr, neither using a cusp-shaped magnetic field nor establishing a negative potential by applying high frequency power is enough to ensure uniformity of the film thickness over a broad region. If an attempt is made to improve the film thickness distribution by increasing the intensity of the cusp-shaped magnetic field (by increasing the current applied to the excitation solenoid 114 and the subsolenoid 126), there would arise a new problem as described in section (3) below, which would reduce the reliability of the resultant LSIs.

(3) Uniformity of Film Thickness of Stepped Portion:

FIG. 3 is a schematic cross sectional view showing the state of coverage of stepped portions when a thin film is formed in the presence of a cusp-shaped magnetic field in accordance with the conventional process.

Referring to FIGS. 1 and 3, when a cusp-shaped magnetic field is created in the vicinity of the substrate 120, ions in the plasma move under the influence of the magnetic field created by the excitation solenoid 114 and have inertia which is retained depending on the mean free path of the particles, with the result that the ions bombard the stepped portions too obliquely to give a symmetric step coverage. The asymmetry in step coverage becomes more pronounced toward the periphery of the substrate, and the substrate is covered as shown in FIG. 3 at its peripheral portion although some variation could be observed depending upon the position of the cusp plane. In the case of LSIs, the asymmetric step coverage results in defective insulation between the wiring patterns or insufficient dielectric strength of the insulators, thus reducing the reliability of LSIs.

More particularly, in an arrangement where an Si substrate 120 having a phosphate silica glass (PSG) film 130 thereon is provided with aluminum (Al) wiring patterns 132, magnetic force lines 134 are directed obliquely, i.e., not at right angles, to the substrate. Therefore, a thin film 136 formed on the substrate has a non-uniform film thickness dependent on the direction of the magnetic force lines.

(4) Lower Temperature Operation of the Process

Due to the aforementioned problems, it has conventionally been unsuccessful to apply a cusp-shaped magnetic field during film formation at a pressure of $10^{-3}$ to $10^{-4}$ Torr in order to form films in a diverging magnetic field. When the waterproofing properties or anti-water permeability of a film formed in a diverging magnetic field at a film formation temperature of 250° C. or lower was examined, the anti-water permeability was found to be equal to or lower than that of a film obtained by the conventional CVD process without the diverging magnetic field. To solve this problem, the CVD process needs to be performed at a $O_2/SiH_4$ ratio of 1.0±0.2 and the gases needs to be supplied in stoichiometric amounts so that the chemical reaction can proceed ideally according to the following reaction scheme:

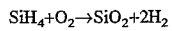

$$SiH_4+O_2 \rightarrow SiO_2+2H_2$$

to reduce the takeup of O-H groups by excessive $O_2$ or the amount of Si-H groups by excessive $SiH_4$. With this countermeasure, good anti-water permeability has been obtained at a film formation temperature of 250° C. or over.

However, these processes have narrow process margins or allowances with regard to the amounts of $SiH_4$ and $O_2$ that are supplied, and as a result minute changes in the control mechanism of the apparatus could decrease the anti-water permeability of the film.

The conventional processes have a problem in that at a temperature of 300° C. or over, the underlying Al wiring patterns are damaged and thus the probability that electromigration might occur increases by leaps and bounds (electromigration is a phenomenon in which intergranular boundaries in polycrystalline Al grow at elevated film formation temperatures, and Al atoms will move or migrate along the intergranular boundaries under application of current).

SUMMARY OF THE INVENTION

Therefore, it is an object of the present invention to solve the aforementioned problems and provide a method for preparing a silicon oxide film having a high waterproofing property, a high resistance to acids, and little stress in the film, which process has a wide margin for the control of the apparatus used and is capable of high productivity.

It is another object of the present invention to provide an apparatus for practicing the manufacture process.

According to one aspect of the present invention, there is provided (section 1) a method of forming a silicon oxide film on a semiconductor substrate in an ECR plasma CVD apparatus having a plasma generation chamber communicating with a plasma reaction chamber holding the substrate, an excitation solenoid being disposed around the plasma generation chamber in a coaxial relationship therewith, wherein the method comprises the steps of:

generating a gas plasma by supplying a plasma raw material gas into the plasma generation chamber, introducing microwave radiation into the plasma generation chamber, and controlling a current flowing through the excitation solenoid to produce a magnetic field in conformity with electron cyclotron resonance conditions in the plasma generation chamber;

extracting the plasma from the plasma generation chamber along lines of magnetic force produced by the excitation solenoid into the plasma reaction chamber;

supplying a reactive gas into the plasma reaction chamber;

directing the plasma onto a surface of the semiconductor substrate disposed in the plasma reaction chamber;

controlling gas pressure in the plasma reaction chamber within the range of $7 \times 10^{-3}$ to $1 \times 10^{-1}$ Torr; and applying high frequency power to the semiconductor substrate.

Here, (section 2) in the method described in section (1) above a second excitation solenoid may be provided in the vicinity of the semiconductor substrate, and the method may further comprise the step of forming a cusp-shaped magnetic field in the vicinity of the semiconductor substrate.

(3) In the method described in section (2) above, the cusp-shaped magnetic field may have a cusp plane at a distance in both directions (above or below) of at most 10 cm from a surface of the semiconductor substrate on which a silicon oxide film is to be formed.

(4) In the method described in section (3) above, $O_2$ gas may be supplied into the plasma generation chamber as the plasma raw material gas, and $SiH_4$ gas may be supplied into the plasma reaction chamber as the reactive gas, at a flow rate ratio $O_2/SiH_4$ of 1.5 or higher at a substrate temperature within the range of 150° to 300° C.

(5) In the method described in section (1) above, $O_2$ gas may be supplied into the plasma generation chamber as the plasma raw material gas, and $SiH_4$ gas may be supplied into the plasma reaction chamber as the reactive gas, at a flow rate ratio $O_2/SiH_4$ of 1±0.2.

(6) In the method described in section (2) above, $O_2$ gas as the plasma raw material gas, and $SiH_4$ gas as the reactive gas, may be supplied into the plasma-generation chamber and the plasma reaction chamber, respectively, at a flow rate ratio $O_2/SiH_4$ of 1±0.2.

(7) In the method described in section (2) above, $O_2$ gas as the plasma raw material gas, and $SiH_4$ gas as the reactive gas, may be supplied into the plasma generation chamber and the plasma reaction chamber, respectively, at a flow rate ratio $O_2/SiH_4$ of 1.5 or higher at a substrate temperature within the range of 150° to 300° C.

According to another aspect of the present invention, there is provided (section 8) an apparatus for forming a silicon oxide film, which comprises:

microwave generation means;

microwave transmission means for transmitting the microwave generated by the microwave generation means;

a plasma generation chamber having a wall, the plasma generation chamber communicating with the microwave transmission means and having gas supply means and an opening defined at the end portion in opposing relationship with the microwave transmission means;

a first excitation solenoid, disposed around the plasma generation chamber in coaxial relationship therewith, for defining a magnetic field for generating plasma from the gas introduced into the plasma generation chamber by the resonant effect with the microwaves;

a plasma reaction chamber for forming a silicon oxide film on a surface of a substrate disposed therein with the plasma, the plasma reaction chamber communicating with the plasma generation chamber through the opening, and having a side wall, a substrate holder with a substrate holding surface on which the substrate is mounted, reactive gas supply means for supplying a reactive gas into the plasma reaction chamber, and gas exhaust means which communicates with the plasma reaction chamber and which exhausts gas in the plasma reaction chamber, the gas exhaust means having a vacuum pump;

an electrostatic chuck, provided in the substrate holder, for attracting the substrate to the substrate holding surface of the substrate holder;

a second excitation solenoid, disposed in opposing relationship with the first excitation solenoid relative to the substrate, for producing a magnetic field whose polarity is opposite to that of the magnetic field produced by the first excitation solenoid in order to provide a cusp-shaped magnetic field in the vicinity of the surface of the substrate; and a power source for applying high frequency power.

(9) In the apparatus described in section (8) above the second solenoid may have an end opposing the surface of the substrate on which a silicon oxide film is to be formed, which end is disposed at a distance of 10 cm or more from the surface of the substrate on which a film is to be formed, whereby the cusp-shaped magnetic field has a cusp plane in a region 10 cm from the surface of the substrate on both sides thereof.

(10) In the apparatus described in section (8) above, the gas exhaust means may comprise a gas exhaust pipe communicating with the plasma reaction chamber for exhausting gas in the plasma reaction chamber, the exhaust pipe having a valve for opening and closing it, and a variable orifice having a variable gas passage area connected to the exhaust pipe parallel to the valve so that gas pressure inside the apparatus can be controlled within the range of $7 \times 10^{-3}$ to $1 \times 10^{-1}$ Torr.

(11) In the apparatus described in section (8) above, the exhaust pipe may be provided in a central region thereof with a gas inlet port for introducing into the exhaust pipe the same gas as that introduced in the plasma generation chamber, $N_2$ gas, or inert gas, so that the gas pressure inside the apparatus can be controlled within the range of $7 \times 10^{-3}$ to $1 \times 10^{-1}$ Torr.

(12) In the apparatus described in section (8) above, the apparatus may further comprise controlling means, connected to the vacuum pump, for controlling the rotational speed of the vacuum pump to change the exhaustion ability of the vacuum pump so that the gas pressure inside the apparatus can be controlled within the range of $7 \times 10^{-3}$ to $1 \times 10^{-1}$ Torr.

(13) In the apparatus described in section (8) above, the apparatus may further comprise a gas inlet port, in the gas supply means or in the wall of the plasma generation chamber, for supplying Ar gas thereto.

(14) In the apparatus described in section (8) above, the reactive gas supply means may have gas inlet ports for supplying phosphine and diborane, respectively, to the reactive gas supply means.

(15) In the apparatus described in section (8) above, the apparatus may further comprise heating means for heating the substrate at a temperature within the range of 150° to 300° C. at the time of film formation.

(16) In the apparatus described in section (8) above, the reactive gas supply means may have gas ejection ports in the side wall of the plasma reaction chamber through which the reactive gas is ejected into the plasma reaction chamber, the gas ejection ports being disposed at a shortest distance of at least 5 cm from the substrate, with the ejection direction and the ejection flow rate of the gas flowing through each of the gas ejection ports being adjusted so that non-uniformity in the distribution in the peripheral direction of the flow rate of gas flowing toward the center of the substrate is within 10% of the total gas flow rate.

In still another aspect of the present invention, there is provided (section 17) an apparatus for forming a silicon oxide film, which comprises:

microwave generation means;

microwave transmission means for transmitting the microwaves generated by the microwave generation means;

a plasma generation chamber having a wall, the plasma generation chamber communicating with the microwave transmission means and having gas supply means and an opening defined at the end portion in opposing relationship with the microwave transmission means;

a first excitation solenoid, disposed around the plasma generation chamber in coaxial relationship therewith, for producing a magnetic field for generating plasma from the gas introduced into the plasma generation chamber by the resonant effect with the microwaves;

a plasma reaction chamber for forming a silicon oxide film on a surface of a substrate disposed therein with the plasma, the plasma reaction chamber communicating with the plasma generation chamber through the opening, and having a side wall, a substrate holder with a substrate holding surface on which the substrate is mounted, reactive gas supply means for supplying a reactive gas into the plasma reaction chamber, and gas exhaust means which communicates with the plasma reaction chamber and which exhausts gas in the plasma reaction chamber, the gas exhaust means having a vacuum pump;

a second excitation solenoid, disposed in opposing relationship with the first excitation solenoid relative to the substrate, for producing a magnetic field whose polarity is opposite to that of the magnetic field produced by the first excitation solenoid so as to provide a cusp-shaped magnetic field in the vicinity of the surface of the substrate;

a power source for applying high frequency power; and pressure control means, associated with the plasma reaction chamber, for controlling the gas pressure in the plasma reaction chamber.

(18) In the apparatus described in section (17) above, the gas exhaust means may comprise a gas exhaust pipe communicating with the plasma reaction chamber to convey gas from the plasma reaction chamber, and the pressure control means may comprise a valve disposed in the gas exhaust pipe for opening and closing the pipe, and a variable orifice having a variable gas passage area connected to the exhaust pipe parallel to the valve so that the gas pressure inside the apparatus can be controlled within the range of $7 \times 10^{-3}$ to $1 \times 10^{-1}$ Torr.

(19) In the apparatus described in section (17) above, the pressure control means may comprise a gas inlet port provided midway in the exhaust pipe for introducing into the exhaust pipe the same gas as that introduced in the plasma generation chamber, $N_2$ gas, or inert gas, so that the gas pressure inside the apparatus can be controlled within the range of $7 \times 10^{-3}$ to $1 \times 10^{-1}$ Torr.

(20) In the apparatus described in section (17) above, the apparatus may further comprise pressure control means connected to the vacuum pump for controlling the rotational speed of the vacuum pump to change the exhaustion ability of the vacuum pump so that the gas pressure inside the apparatus can be controlled within the range of $7 \times 10^{-3}$ to $1 \times 10^{-1}$ Torr.

(21) In the apparatus described in section (17) the apparatus may further comprise a gas inlet port, in the gas supply means or in the wall of the plasma generation chamber, for supplying Ar gas thereto.

(22) In the apparatus described in section (17) above, the reactive gas supply means may have therein gas inlet ports for supplying phosphine and diborane, respectively, to the reactive gas supply means.

(23) In the apparatus described in section (17) above, the apparatus may further comprise heating means for heating the substrate at a temperature within the range of 150° to 300° C. at the time of film formation.

(24) In the apparatus described in section (17) above, the reactive gas supply means may have gas ejection ports in the side wall of the plasma reaction chamber through which the reactive gas is ejected into the plasma reaction chamber, the gas ejection ports being disposed at a shortest distance of at least 5 cm from the substrate, with the ejection direction and the ejection flow rate of gas flowing through each of the gas ejection ports being adjusted so that non-uniformity in distribution in the peripheral direction of the flow rate of gas flowing toward the center of the substrate can be within 10% of the total gas flow rate.

(25) In the apparatus described in section (17) above, the second solenoid may have an end opposing the surface of the substrate on which a silicon oxide film is to be formed, which end is disposed at a distance of 10cm or more from the surface of the substrate on which a film is to be formed, whereby the cusp-shaped magnetic field has a cusp plane in a region 10 cm from the surface of the substrate on either side thereof.

According to the present invention, which forms a silicon oxide film using an ECR plasma CVD apparatus, power at a high frequency is applied to the substrate and a relatively high gas pressure is used. Due to a synergistic effect between the high frequency power and a cusp-shaped magnetic field, a silicon oxide film having increased uniformity in the film thickness and quality distributions, good step coverage, and an improved waterproofing property can be formed on a substrate of large diameter by a low temperature process. Moreover film qualities such as the internal stress and the acid resistance of the film are not compromised, unlike films formed by the conventional ECR plasma CVD process. The use of a film formed by the process of the present invention in LSIs increases the reliability of the LSIs.

Furthermore, while it has been difficult with a conventional apparatus of the aforementioned type to run the apparatus stably since precise control of the apparatus is required, the present invention allows wider process margins for various parameters that need to be controlled, especially the $O_2$ flow rate, the microwave power, the magnitudes of the magnetic fields created by first and second excitation solenoids, and pressure. As a result prolonged, stable running of the apparatus is possible, and hence continuous fabrication of LSIs can be performed with high reliability.

The above and other objects, effects, features and advantages of the present invention will become more apparent from the following description of embodiments thereof taken in conjunction with the accompanying drawings.

DESCRIPTION OF PREFERRED EMBODIMENTS

The present invention will be described in detail with reference to the accompanying drawings.

Figure 4:
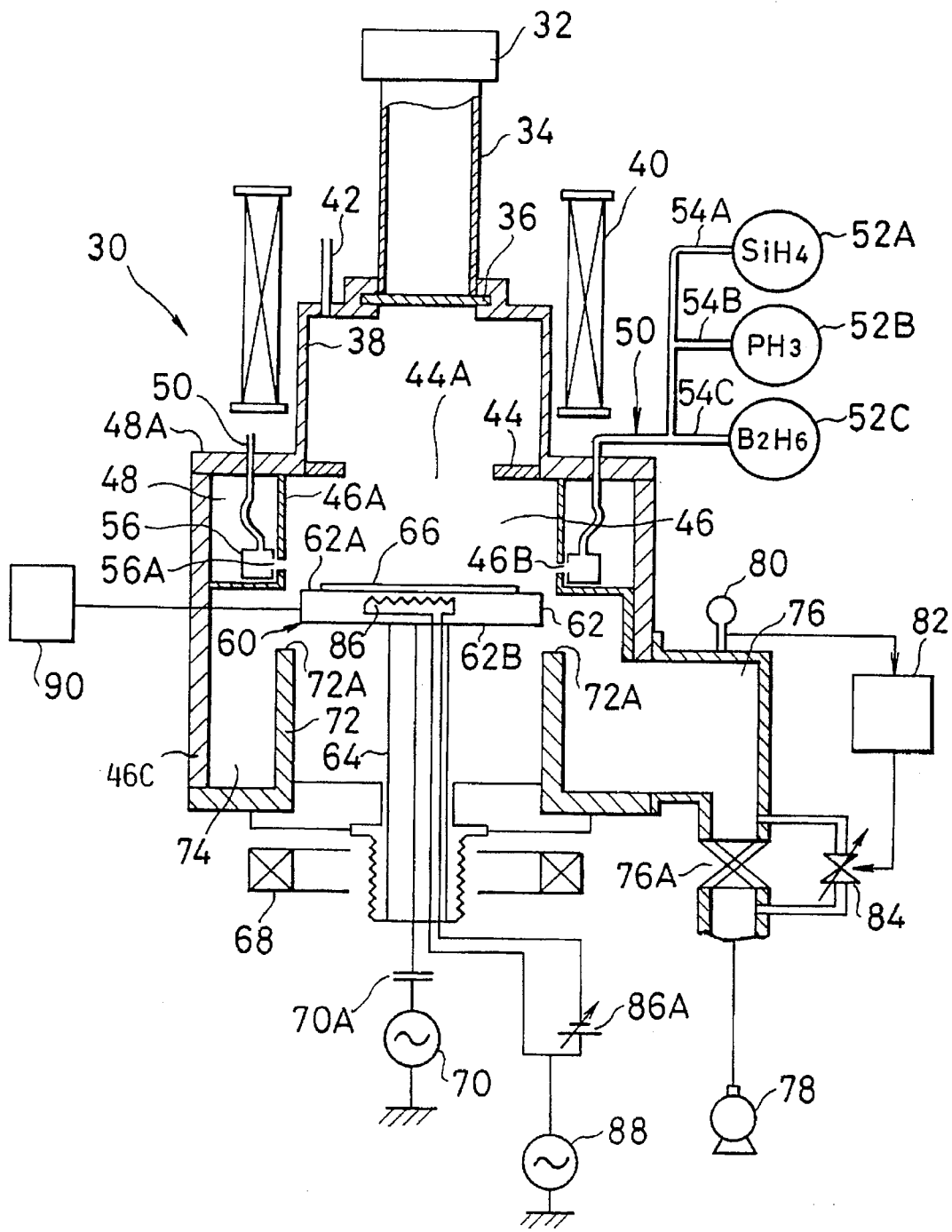
FIG. 4 is a cross sectional view showing an apparatus for forming a silicon oxide film in accordance with an embodiment of the present invention.

FIG. 4 is a schematic cross sectional view which shows an apparatus for forming a silicon oxide film according to an embodiment of the present invention. In FIG. 4, reference numeral 30 denotes an apparatus for forming a silicon oxide film. The apparatus 30 includes a microwave power source 32 which is connected to a waveguide 34. The waveguide 34 is attached to a plasma generation chamber 38, which is generally cylindrical in shape, via a waveguide window 36 made of quartz, for example. Around the plasma generation chamber 38 is disposed an excitation solenoid 40. Further, a first gas supply conduit 42 for introducing a plasma generation gas into the plasma generation chamber 38 is provided on the upper end thereof vertically, parallel to the waveguide 34. On the lower portion of the plasma generation chamber 38 is a plate 44 made of a metal, for example. The plate 44 has a large opening 44A in the center thereof. The plasma generation chamber 38 communicates with a plasma reaction chamber or processing chamber 46 via the opening 44A. The opening 44A serves as a plasma take-out window through which plasma is drawn out into the plasma reaction chamber 46. An annular chamber 48 surrounds the upper portion of the plasma reaction chamber 46 coaxially and is separated by a partition wall or inner side wall 46A from the plasma reaction chamber 46. The annular chamber 48 has an upper wall 48A, through which a second gas supply conduit 50 extends into the annular chamber 48. One end of the second gas supply conduit 50 is connected to monomer gas bombs 52A, 52B and 52C through pipes 54A, 54B and 54C, respectively. The other end of the second gas supply conduit 50 is connected to a plurality of gas distributors 56 having gas ejection ports 56A of the same diameter, arranged at the same distance one from another along the periphery or inner side wall 46A of the plasma reaction chamber 46. The gas ejection ports 56A are disposed behind corresponding throughholes 46B formed in the inner side wall 46A at the same height and at the same distance one from another, to allow reaction gas from the second gas supply conduit 50 to flow into the plasma reaction chamber 46 as uniformly as possible.

A substrate holder 60 is arranged inside the plasma reaction chamber 46 and at a position downstream of the inlet port of the plasma, i.e., plasma take-out window 44. The substrate holder 60 has a horizontal stage 62 and a shaft 64. The stage 62 has an upper surface on which a substrate 66 is mounted. Below the rear side 62B of the stage 62 of the substrate holder 60 is arranged a second excitation solenoid or subsolenoid 68 which is coaxial to the first excitation solenoid 40 and which creates a magnetic field whose polarity is opposite to that of the magnetic field created by the first excitation solenoid 40 so that a cusp-shaped magnetic field is created in the vicinity of the surface 62A of the substrate. The substrate holder 60 is connected to a high frequency power source 70 through a condenser 70A. Below the stage 62 of the substrate holder 60 is arranged a circular partition wall 72, which defines an annular exhaust chamber 74 together with the outer wall 46C of the plasma reaction chamber 46. There is a gap between the top 72A of the partition wall 72 and the rear surface 62B of the stage 62 and the exhaust chamber 74 communicates with the plasma reaction chamber 46 through the gap. The exhaust chamber 74 is connected to a vacuum exhaust system, for example vacuum pump 78, through a vacuum exhaust pipe 76 having a valve 76A. A vacuum meter or barometer 80 is connected to the vacuum exhaust pipe 76 to measure the gas pressure inside the apparatus. The vacuum meter 80 is connected to a feedback circuit 82 to which data about the gas pressure inside the apparatus are inputted. The feedback circuit 82 is connected to a variable orifice 84 having a variable gas passage area and controls the opening of the variable orifice 84.

An electrostatic chuck 86 is affixed to the stage 62 of the substrate holder 60 supporting the substrate 66. The electrostatic chuck 86 is arranged such that the surface of the stage 62 of the substrate holder on which the substrate 66 is held, i.e., the upper surface 62A of the stage, serves as an attraction surface of the electrostatic chuck 86. An RF power source 88 is provided, which supplies RF power to the attraction electrode of the electrostatic chuck 86. The intensity of the attraction can be varied through a variable condenser 86A. A temperature control means 90 for controlling the temperature of the stage 62 of the substrate holder 60 independently of the RF power may be provided. An example of the temperature control means 90 is a conventional water cooling system.

Next, an apparatus for forming a silicon oxide film in accordance with another embodiment of the present invention will be explained.

Figure 5A:
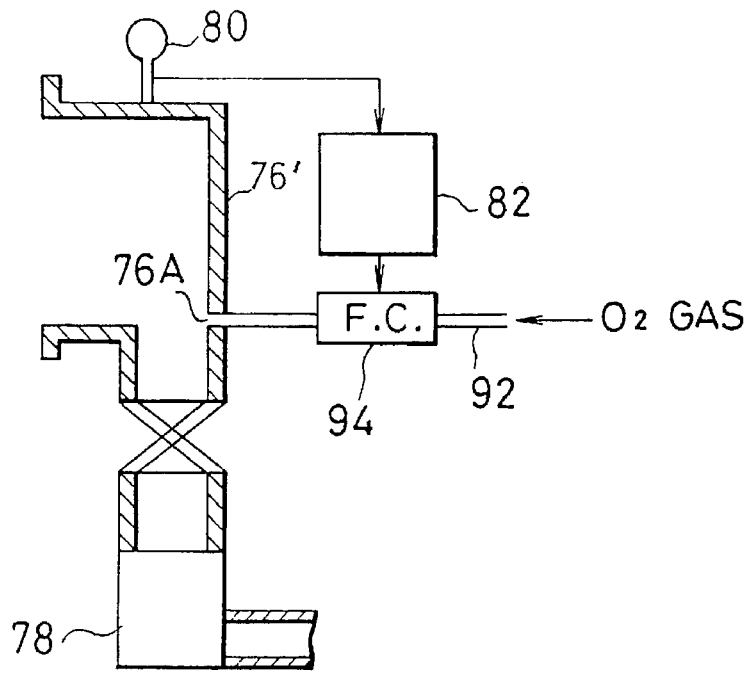
FIG. 5A is a schematic cross sectional view showing part of an apparatus for forming a silicon oxide film in accordance with another embodiment of the present invention, this embodiment having a pressure control system different from that used in the apparatus shown in FIG. 4.

FIG. 5A is a schematic partial enlarged cross sectional view showing part of an apparatus for forming a silicon oxide film, i.e., a pressure control portion having a different construction than that used in the aforementioned embodiment shown in FIG. 4. In the arrangement shown in FIG. 5A, a modified vacuum exhaust pipe 76' replaces the vacuum exhaust pipe 76 of FIG. 4. Midway therein exhaust pipe 76' has a gas inlet port 76A to which a gas supply pipe 92 is connected. The gas supply pipe 92 is provided with a flow rate control means 94 connected to and controlled by the feedback circuit 82, which receives data about the gas pressure inside the apparatus. The same gas as that introduced in the plasma generation chamber 38 through the first gas conduit 42, such as $O_2$ gas, or other gases such as $N_2$ gas or inert gas, is fed into the plasma reaction chamber 46 through the gas supply pipe 92 and through the gas inlet port 76A. The presence of the gas introduced through inlet port 76A in the gas exhausted from the plasma reaction chamber 46 reduces the amount of gas actually exhausted from the plasma reaction chamber by the vacuum pump 78. Thus, the gas pressure inside the apparatus can be controlled, if a pump 78 with a constant exhaust ability is used, by controlling the amount of the introduced gas passing through the gas inlet port 76A by means of the flow rate control means 94. The arrangement of other components of the apparatus 30 is the same or equivalent to those in the arrangement shown in FIG. 4.

Figure 5B:
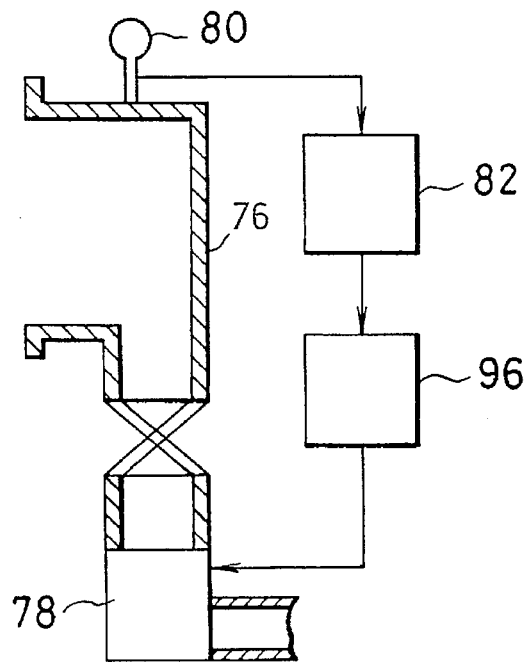
FIG. 5B is a schematic cross sectional view showing part of an apparatus for forming a silicon oxide film in accordance with another embodiment of the present invention, this embodiment also having a pressure control system different from that shown in FIG. 4.

FIG. 5B is a schematic partial enlarged cross sectional view showing a part of an apparatus for forming a silicon oxide film, i.e., a pressure control portion having a different construction than that used in the aforementioned embodiment shown in FIG. 4. In the arrangement shown in FIG. 5B, the apparatus 30 has a frequency converting means 96 connected to and controlled by the feedback circuit 82, which receives data about the gas pressure inside the apparatus. The frequency converting means 96 supplies power whose frequency has been varied to the vacuum pump 78 to change the amount of gas exhausted by the vacuum pump 78 so that the gas pressure inside the apparatus 30 can be maintained at a desired value.

Now, referring to FIG. 4, the process for forming a silicon oxide film will be described concretely.

Figure 6:
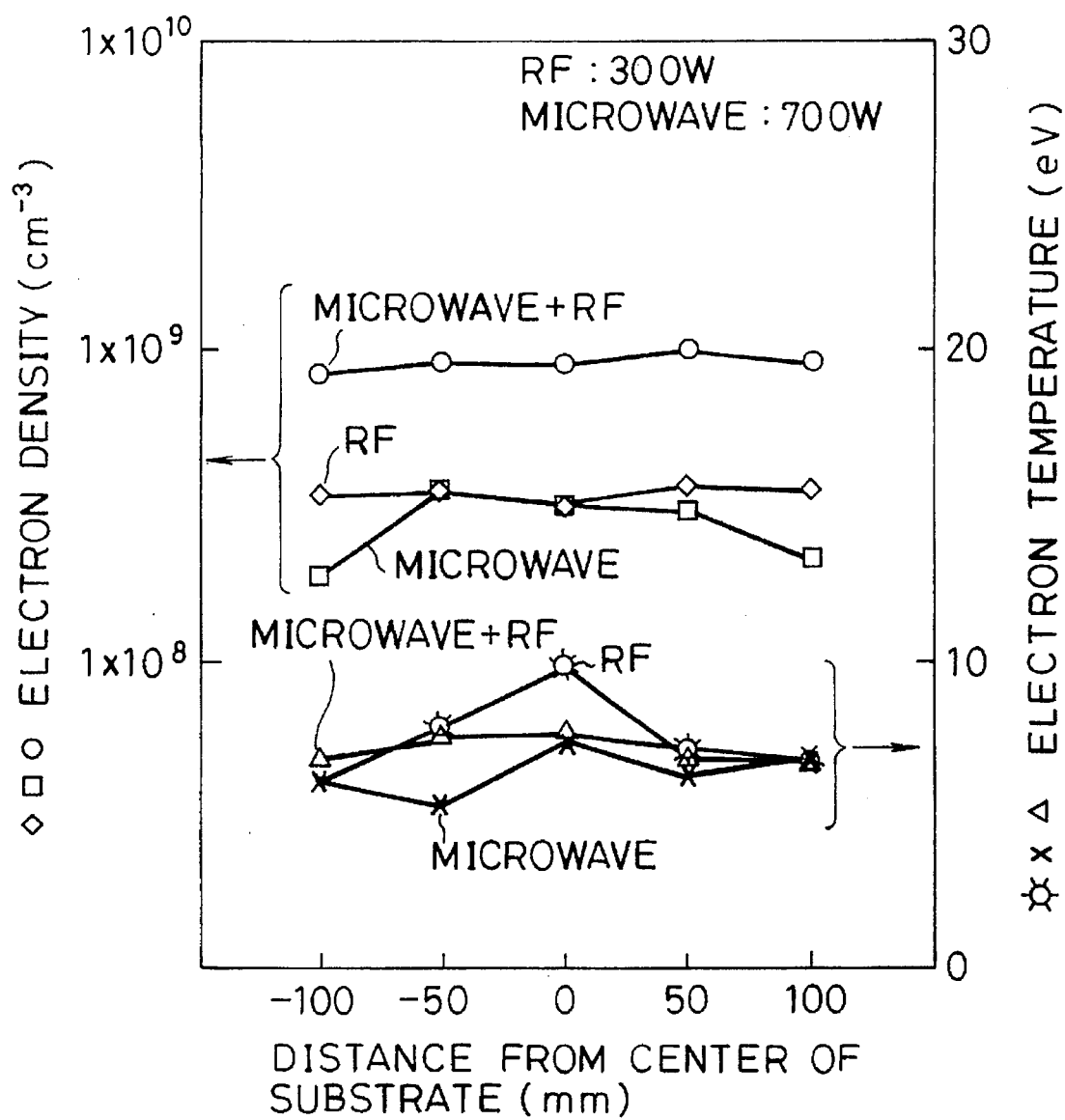
FIG. 6 is a graph illustrating the contributions of microwave power and high frequency power to plasma density (electron density) and electron temperature separately when a film is formed in accordance with the present invention.

In the ECR plasma CVD process, plasma is generated in the plasma generation chamber 46 by increasing the gas pressure in the plasma reaction chamber 46 to a value higher than the gas pressure of $10^{-3}$ to $10^{-4}$ Torr usually used, and applying high frequency power to the substrate 66 (hereafter, referred to as "RF power" or "RF bias"). Plasma is thus generated due to the RF power applied to the substrate 66. Accordingly, the first plasma, i.e., the plasma generated in the plasma generation chamber 38 by electron cyclotron resonance and drawn in the direction in which the magnetic field generated by the excitation solenoid 40 is diverging (ECR plasma), and the second plasma, i.e., the plasma generated by the RF power (RF plasma), are combined around the substrate 66 to form a complex plasma. The generation of complex plasma will be well understood from FIG. 6, which is a graph illustrating the contributions of microwave power and of high frequency power to the plasma density (electron density) and the electron temperature separately in the film formation process in accordance with the present invention, with the electron density of $O_2$ plasma being measured by a plasma probe method using double probes. As will be clear from FIG. 6, which shows a complex plasma composed of ECR plasma and RF plasma in equal proportions, the electron density when the RF power is applied is larger by about two times than the electron density without the application of RF power.

The plasma generated in the plasma generation chamber 38 (ECR plasma), even when a cusp-shaped magnetic field is created in the vicinity of the substrate 66, contributes more to the film formation in the central portion of the substrate due to inertia of the ions in the plasma while the ions are moving along the magnetic field created by the excitation solenoid 40. On the other hand, the RF plasma generated by the RF power in the plasma reaction chamber contributes more to the film formation in the peripheral portion of the substrate. This is due to the fact that the electric field, which is created by a negative potential relative to the ground appearing on the surface of the substrate, increases in the peripheral portion of the substrate, with the plasma reaction chamber serving as an opposite electrode relative to the substrate. When the gas pressure is as low as $10^{-3}$ to $10^{-4}$ Torr as used conventionally, the density of the plasma drawn from the plasma generation chamber and introduced into the plasma reaction chamber increases. On the other hand, the negative bias potential on the surface of the substrate created by the application of the RF power is inversely proportional to the density of the plasma. From these factors it follows that, in order to obtain a bias potential strong enough to give drape characteristics or step coverage, application of considerably high RF power is required, resulting in that the film formation on the surface of the substrate is greater in the central portion than in the peripheral portion. However, when the gas pressure is higher, the mean free path of the gas molecules is smaller, and electrons participating in the ionization of the gas molecules in the plasma generation chamber collide with the gas molecules before they can be accelerated to a speed necessary for the ionization. This makes it difficult for ionization to occur, thus decreasing the density of plasma.

On the other hand, the plasma generation in the plasma reaction chamber, i.e. the generation of RF plasma, is performed by the application of RF power having a high frequency, usually 13.56 MHz, which is smaller by at least two orders of magnitude than the frequency of the microwaves (usually 2.45 GHz). At gas pressures within the range of $10^{-1}$ to $10^{-3}$ Torr, the plasma is stabilized with increasing pressure, so that the density of plasma in the plasma reaction chamber becomes higher than the density of plasma in the plasma generation chamber, although at such a gas pressure the density of plasma is not so high as the density of plasma generated in the plasma generation chamber at a gas pressure within the range of $10^{-3}$ to $10^{-4}$ Torr. In addition, at gas pressures within the range of $10^{-1}$ to $10^{31\ 3}$ Torr, a bias potential of a level necessary for giving step coverage can be obtained more readily. These factors, coupled with the increasing intensity of the electric field in the vicinity of the peripheral portion of the substrate, cause film formation in the peripheral portion to increase.

Figure 7:
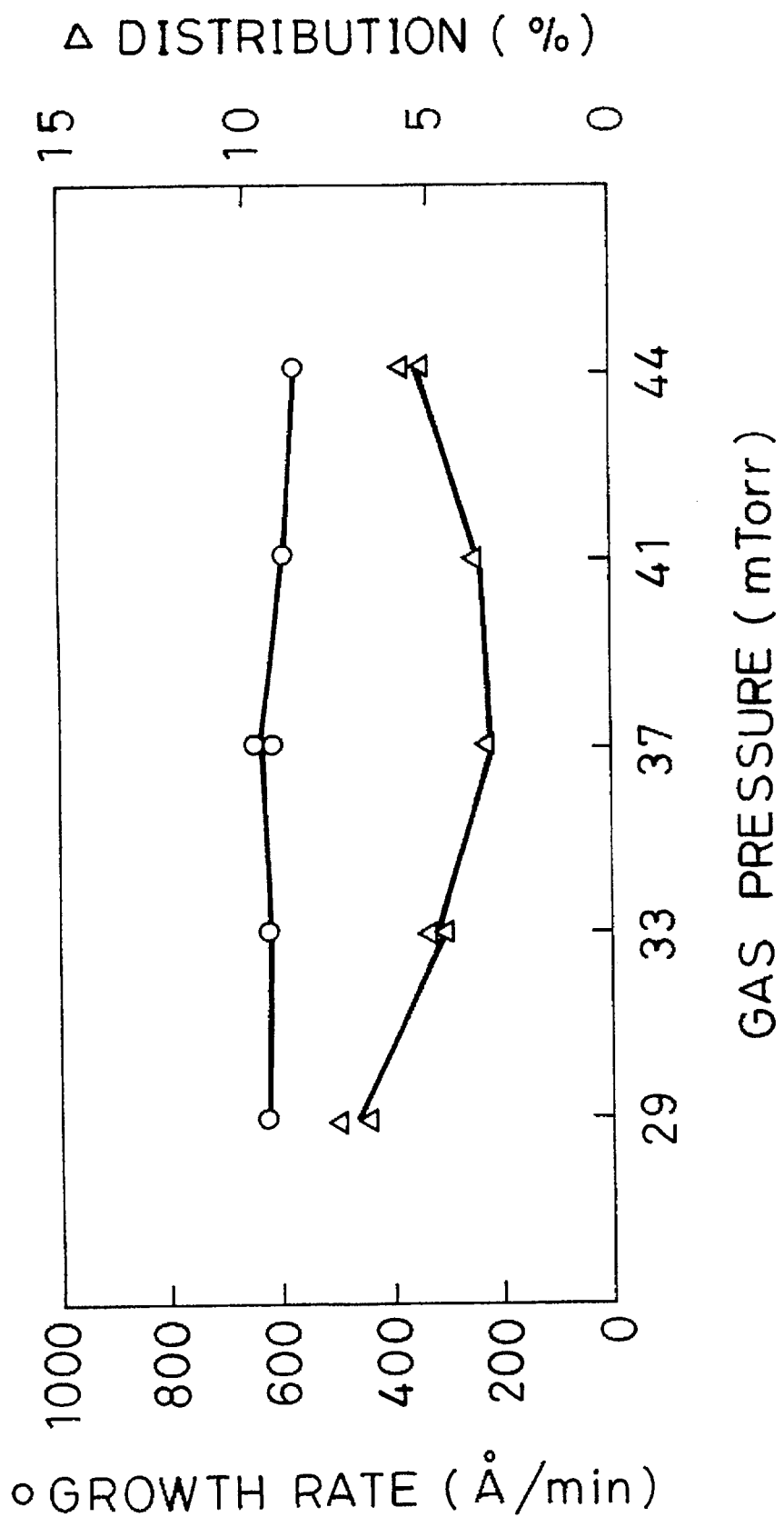
FIG. 7 is a graph illustrating how the growth rate and the film thickness distribution, respectively, depend on the gas pressure when a film is formed on an 8-inch substrate by a process for forming a silicon oxide film according to one embodiment of the present invention.
Figure 8:
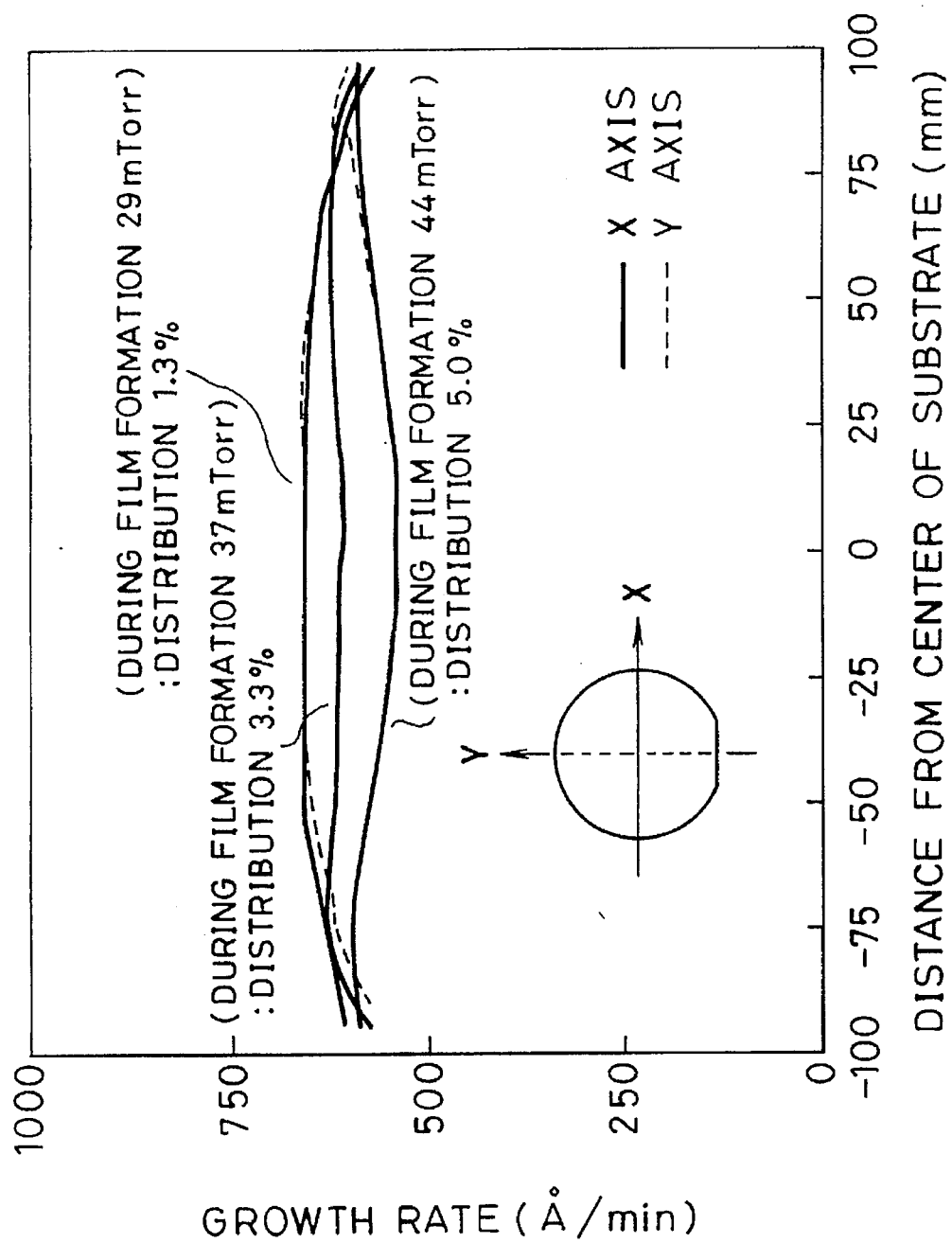
FIG. 8 is a graph illustrating how the planar distribution of the growth rate depends on the gas pressure for a film formed on an 8-inch substrate by a process for forming a silicon oxide film according to one embodiment of the present invention.

FIG. 7 is a graph illustrating how the growth rate and the film thickness distribution depend on the gas pressure when a silicon oxide film is formed on an 8-inch substrate by a process according to one embodiment of the present invention; and FIG. 8 is a graph illustrating how the planar distribution of the growth rate depends on the gas pressure when a silicon oxide film is formed on an 8-inch substrate by a process according to one embodiment of the present invention.

As a result of experiments performed by the present inventors, as will be clear from FIGS. 7 and 8, a thin film having a uniform film thickness distribution can be formed on a substrate having a diameter of 8 inches by setting the gas pressure to a value within the aforementioned range. On this occasion, the film thickness distribution can be reduced to a minimum value by controlling the gas pressure during the film formation.

As will be understood from FIG. 21C, which will be explained in detail later on, in the case of a silicon oxide film, the film thickness distribution varies little even when a cusp-shaped magnetic field is created and the cusp plane is shifted. The effect of the cusp-shaped magnetic field on the improvement in the film thickness distribution decreases relatively with an increase in the gas pressure, and that effect disappears substantially at a gas pressure within the range of $7 \times 10^{-3}$ to $1 \times 10^{-1}$ Torr.

As described above, the improvement in the film thickness distribution can be achieved by maintaining the gas pressure at a high level and applying RF power. The influence of the RF power on the film thickness distribution is not so great as the gas pressure. Therefore, the film thickness distribution can readily be minimized by controlling the gas pressure.

Figure 1:
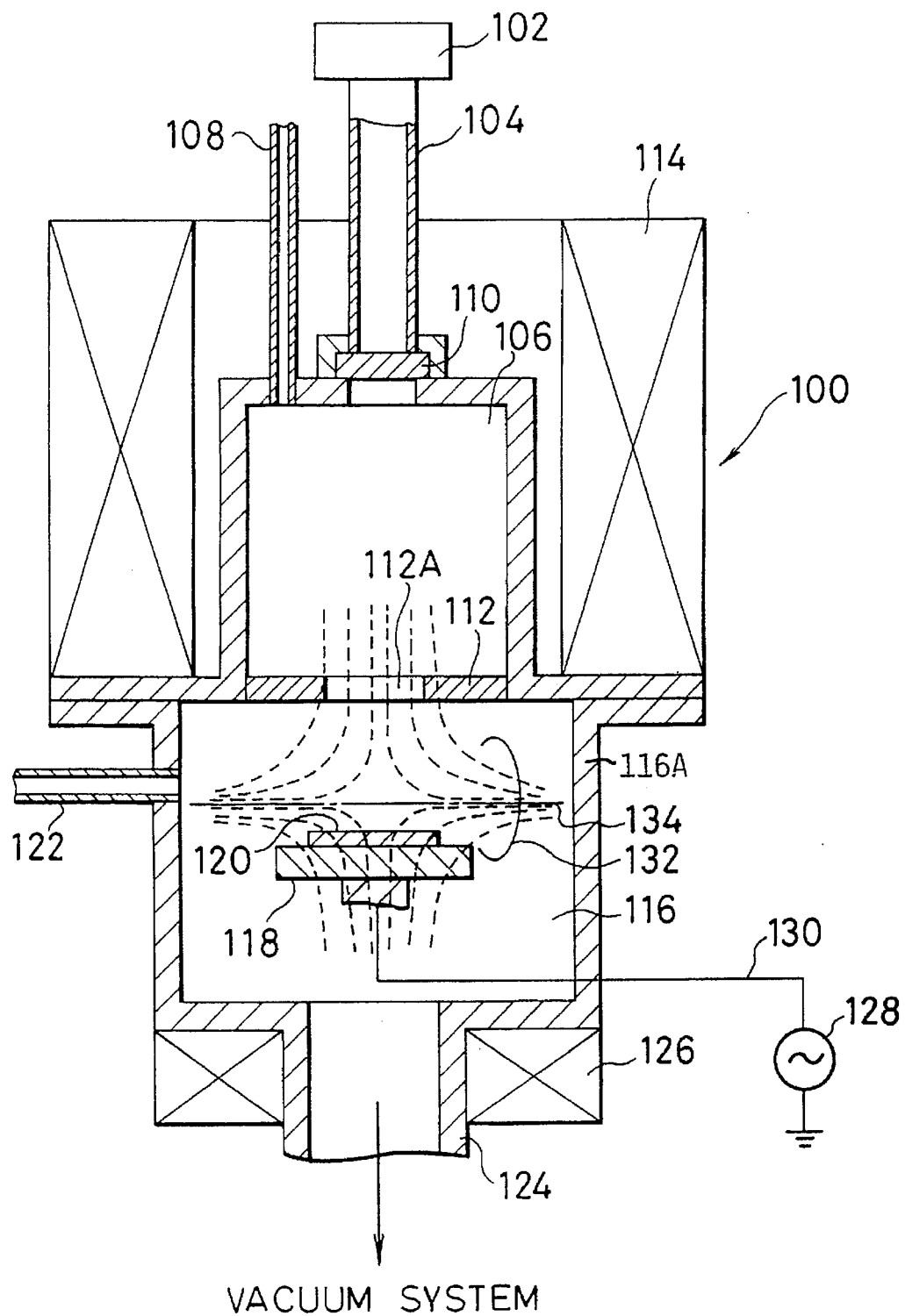
FIG. 1 is a schematic cross sectional view showing a conventional ECR plasma CVD apparatus.

In the ECR plasma CVD apparatuses, a take-out window (reference numeral 112A in FIG. 1) is provided between the plasma generation chamber and the plasma reaction chamber to increase the amount of microwave energy which is accumulated in the plasma generation chamber so that the generation of plasma can be made easier, and such a take-out window is unnecessary for the action of the plasma after it has once been generated. In the absence of take-out windows, plasma generation can be initiated by using an arc discharge. The resonance of a magnetic field with microwaves is effective at a gas pressure of up to about 1 Torr, and thus plasma generation can be initiated without any take-out window. Of course, initiation of plasma generation in the gas pressure range used in the present invention is possible without-difficulty.

When the gas pressure is increased, RF power is applied to the substrate, and a cusp-shaped magnetic field is created in the vicinity of the substrate, the energy of the RF electric field is absorbed by electrons in the plasma efficiently due to an increase in the horizontal component of the magnetic field, which is brought about by the RF electric field vertical to the substrate and the pattern or form of the cusp-shaped magnetic field. As a result the activity of the plasma in the vicinity of the substrate is increased by 3 to 5 times the original level. This was confirmed by the following methods.

Figure 9:
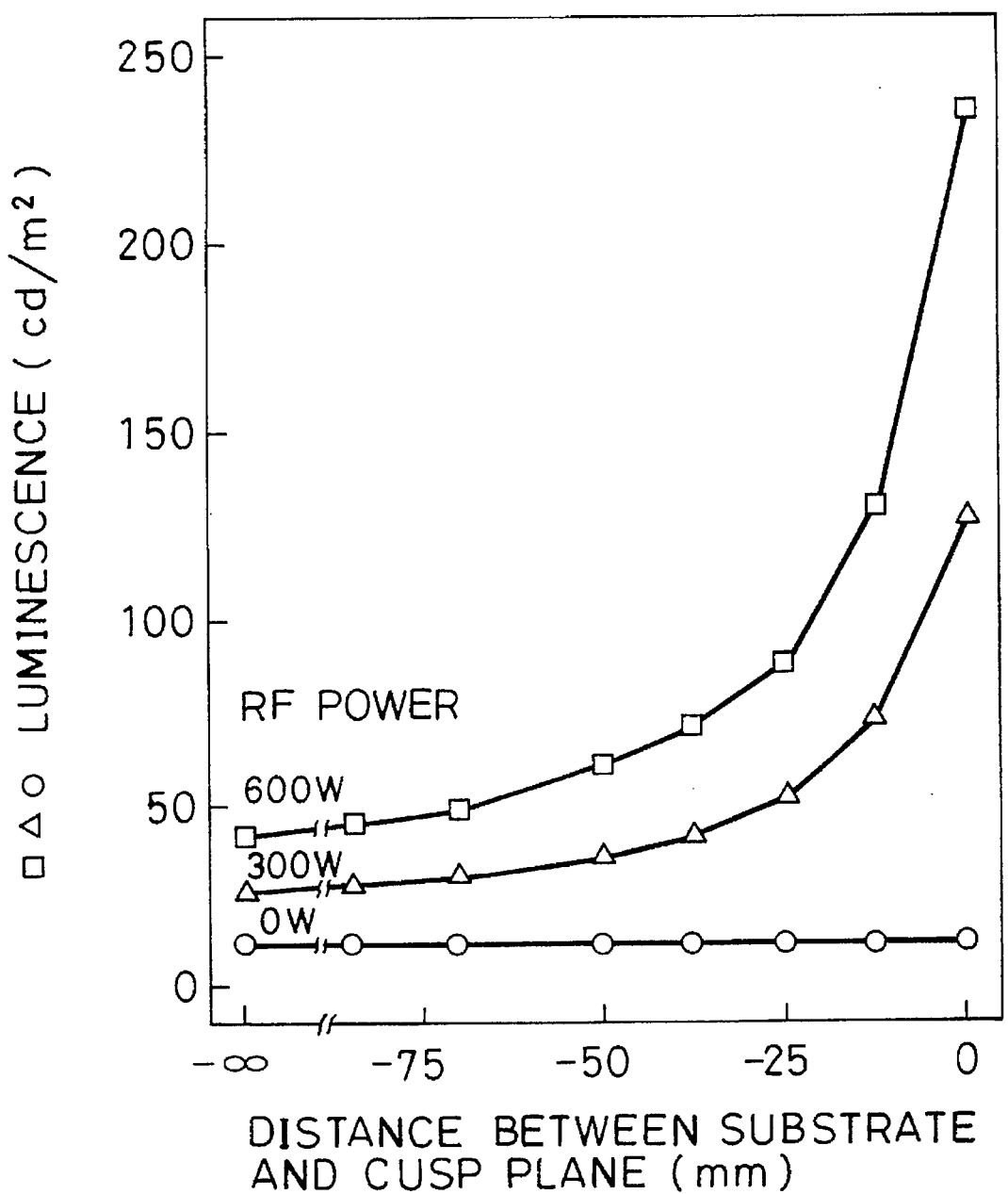
FIG. 9 is a graph illustrating how the intensity of plasma luminescence of plasma generated during film formation according to the process of the present invention depends on the position of the cusp plane, using RF power that is applied to the substrate as a parameter.

(1) FIG. 9 is a graph illustrating the intensity of plasma luminescence of plasma generated just above a semiconductor substrate under actual film forming conditions ($SiH_4$ gas flow rate: 23 SCCM, $O_2$ gas flow rate: 47 SCCM, microwave power: 700 W, RF power: 0 W, 300 W, 600 W, pressure: 37 mTorr) in the presence of a cusp-shaped magnetic field. As illustrated in FIG. 9, the intensity of the plasma luminescence is not influenced by the cusp-shaped magnetic field at an RF power of 0 W, but when RF power is applied, the plasma luminescence intensity increases sharply as the horizontal component of the magnetic field increases. This indicates that the RF power is absorbed by the plasma in the vicinity of the substrate efficiently.

Figure 10:
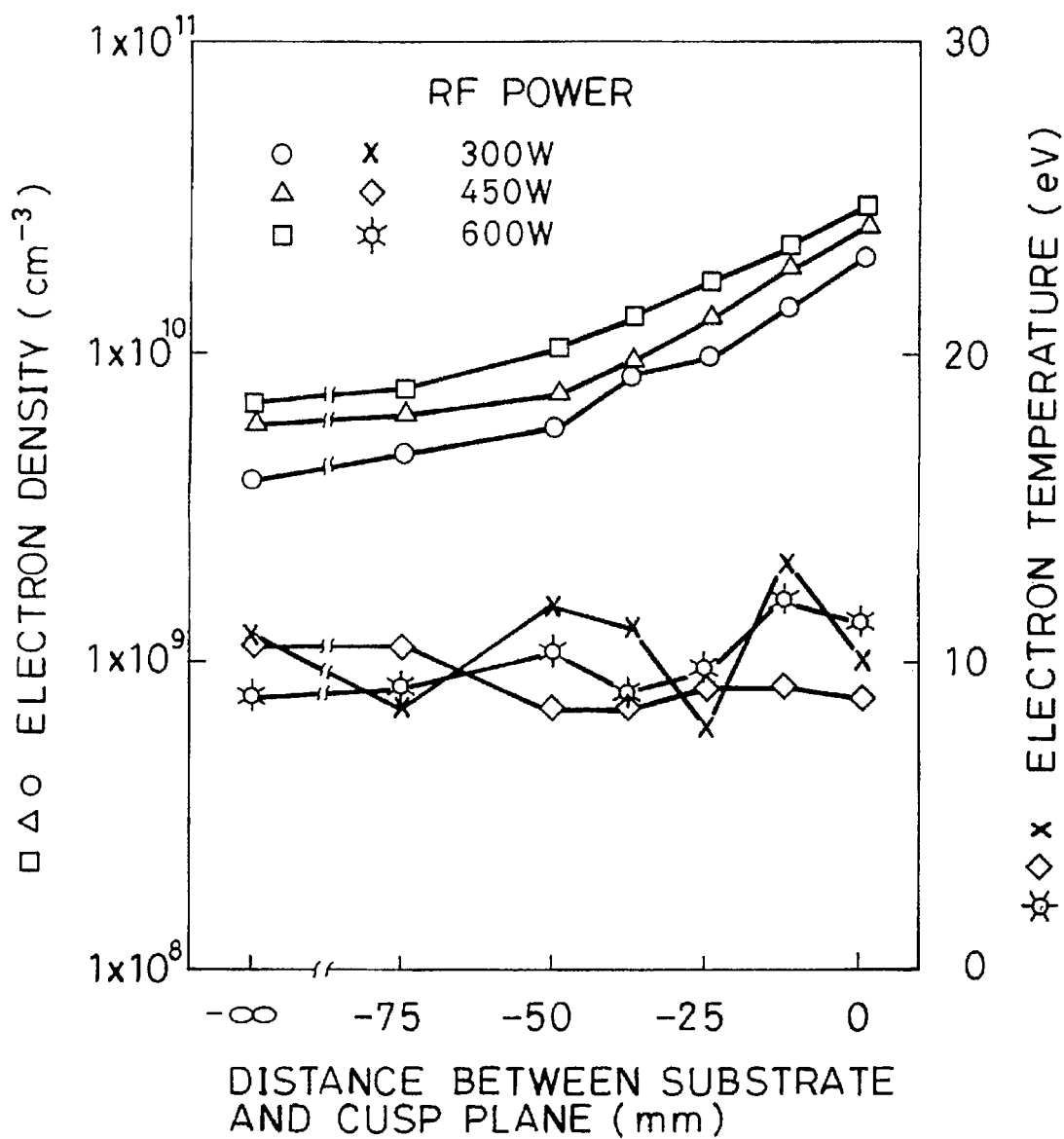
FIG. 10 is a graph illustrating how the electron density and the electron temperature during film formation according to the process of the present invention depend on the position of the cusp plane, using RF power that is applied to the substrate as a parameter.

(2) Another example is provided by the measurement of the electron density using a plasma probe. FIG. 10 is a graph illustrating the results of such a measurement. As illustrated in FIG. 10, the plasma density increased to four times its original value due to a synergistic effect of the cusp-shaped magnetic field and RF electric field. On this occasion the plasma generation was carried out under the conditions of $O_2$ flow rate: 47 SCCM, microwave power: 700 W, RF power: 300 W, 450 W, 600 W, and pressure: 37 mTorr.

Figure 11:
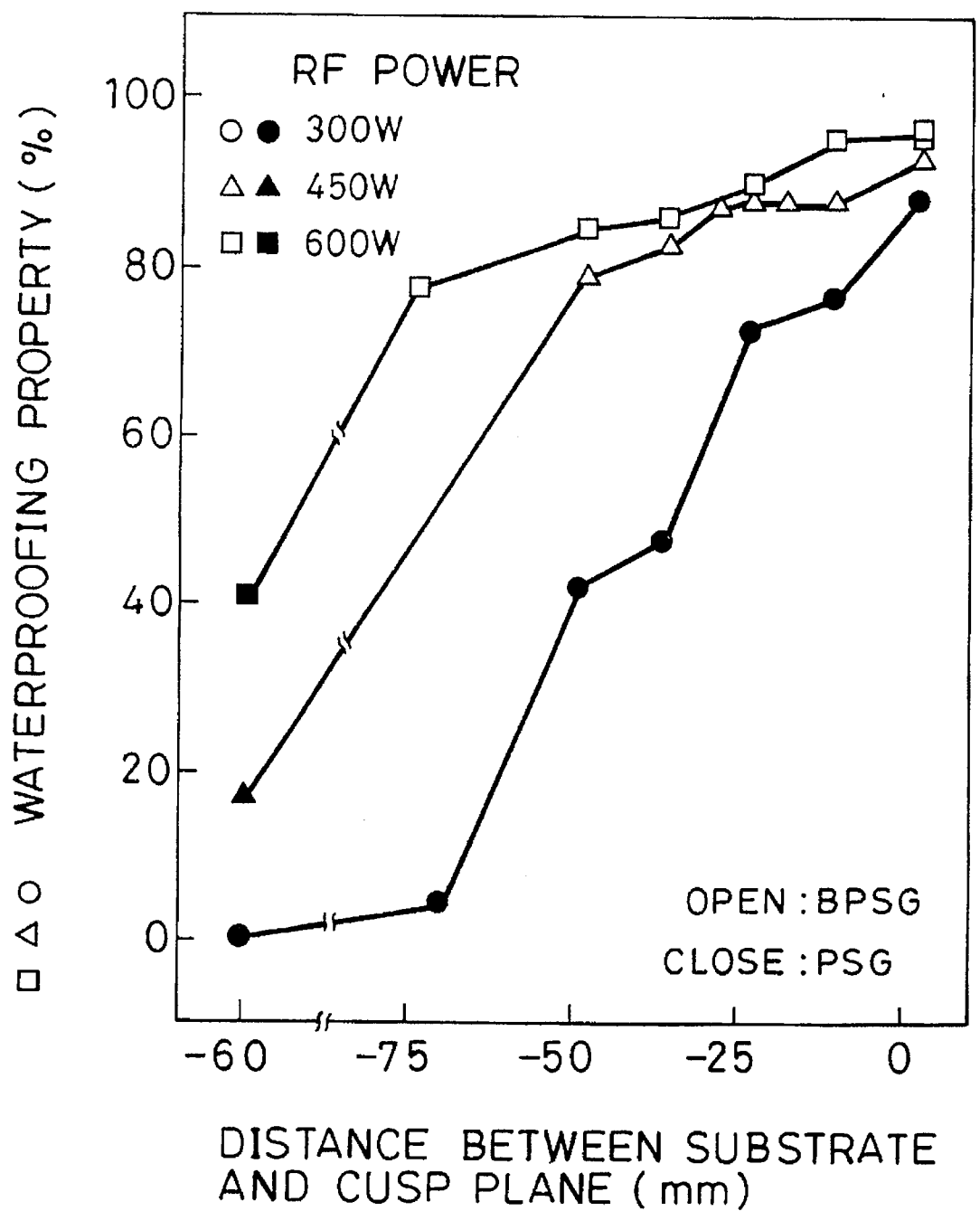
FIG. 11 is a graph illustrating how the waterproofing property during film formation according to the process of the present invention depends on the position of the cusp plane, using RF power that is applied to the substrate as a parameter.

One of the most important effects obtained by the use of a cusp-shaped magnetic field in combination with RF power is that the resulting thin film has a high waterproofing property. FIG. 11 is a graph illustrating the waterproofing property of a thin film formed under the conditions illustrated in FIG. 9. In FIG. 11, the vertical axis indicates that the waterproofing property is 100% when the amount of permeated water is 0 (i.e., when the amount of water passing through the film is 0) and decreases with an increasing amount of permeated water.

Figure 12:
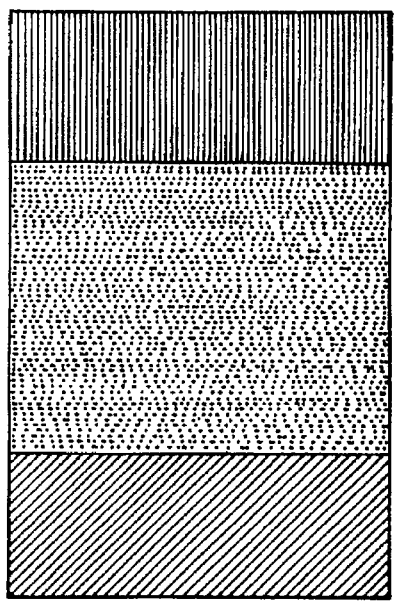
FIG. 12 is a schematic view illustrating how to test the waterproofing property of a silicon oxide film formed on a substrate.

Tests on the waterproofing property were performed as follows. As shown in FIG. 12, a PSG or BPSG film was formed on an Si substrate to give a sample having a film with double bonds formed by P and O, i.e., P=O, and a silicon oxide film (hereafter, also referred to as an "$SiO_2$ film") that was to be evaluated was formed on the PSG or BPSG film to a thickness of 3,000 Å (Angstroms). For a measurement of initial values, the absorption peak amount of P=O at a wave number near 1,320 $cm^{-1}$ was measured using an IR spectral analyzer. Then the sample was placed in a thermohygrostatic oven and allowed to stand at 120° C. for 100 hours in an atmosphere with a relative humidity of 100%, and a pressure of 2 atm. After taking the sample out of the oven, the residual amount of P=O was measured by IR spectral analysis, and the percentage of the value obtained relative to the initial value was calculated. If the $SiO_2$ film on the surface permeated moisture, that is, if moisture passed through the film, the P=O contained in the underlying film (i.e., PSG or BPSG film) would be hydrolyzed and the amount thereof decreased. Therefore, according to the aforementioned test method, the amount of water permeating the $SiO_2$ film was measured.

Figure 13:
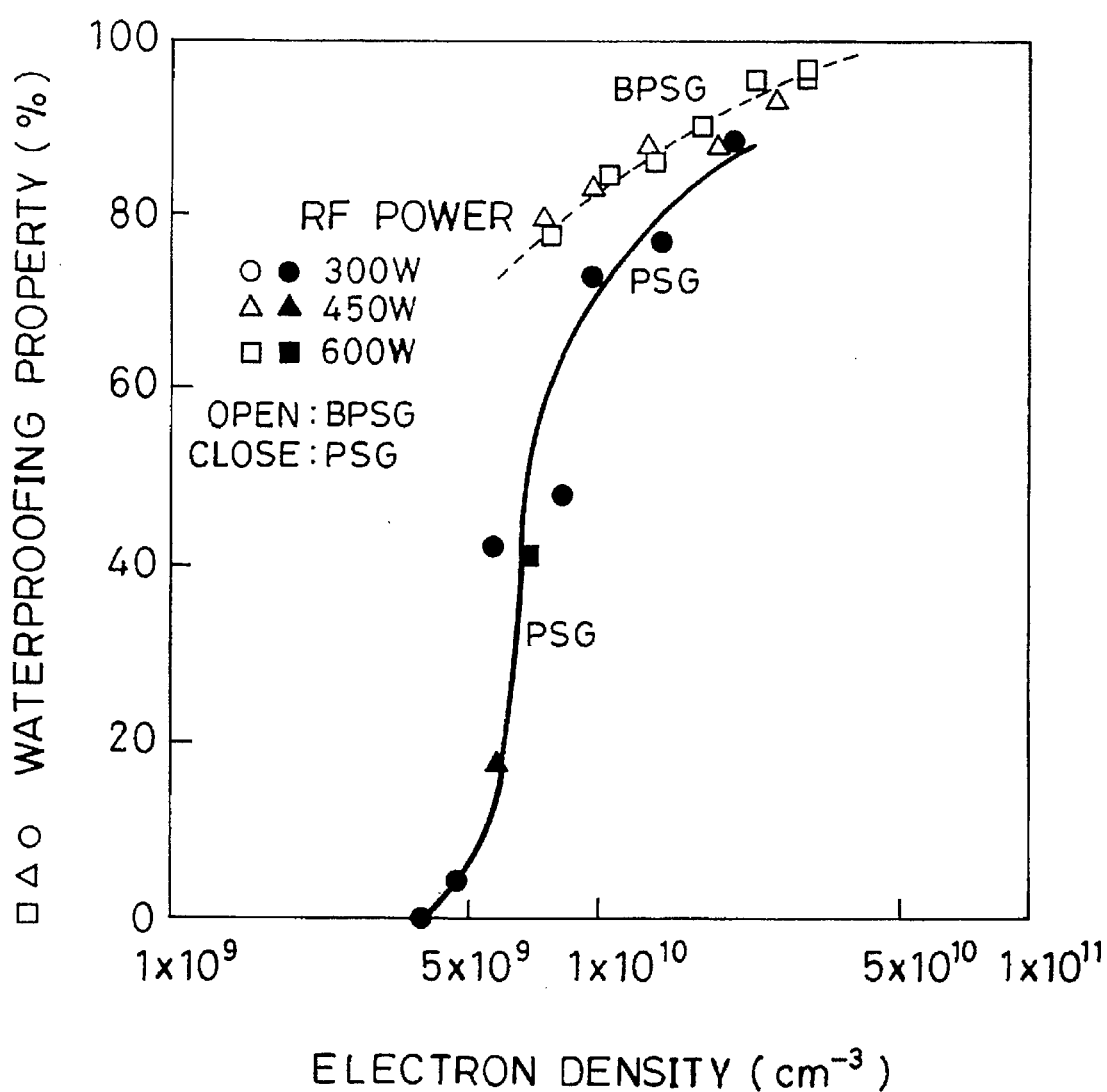
FIG. 13 is a graph illustrating how the waterproofing property of a film formed according to the process of the present invention depends on the electron density, using RF power that is applied to the substrate as a parameter.

A correlation between the results obtained above and the results shown in FIG. 10 is illustrated in FIG. 13. FIG. 13 indicates that an increase in the activity of the plasma due to a synergistic effect between a cusp-shaped magnetic field and an RF electric field gives rise to a thin film having a good waterproofing property. It is noted that a comparison between PSG and BPSG cannot be made by absolute values since the amount of P=O in the film and its hydrolysis rate are more or less different one from another.

Figure 14A:
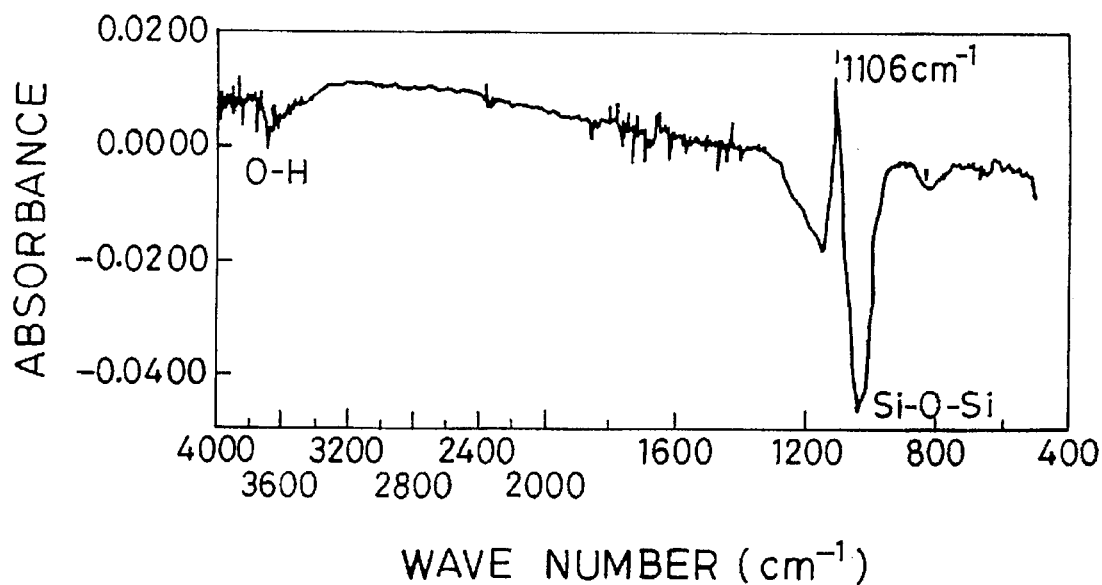
FIG. 14A is a diagram illustrating an infrared absorption spectrum, indirectly indicating a difference in the waterproofing property between a case where the cusp plane was above the surface of the substrate and a case where it was an infinite distance from the rear side of the substrate.

The present inventors have compared a film having good waterproofing properties and a film having poor waterproofing properties, respectively, by IR absorption spectral analysis, and the results are shown in FIG. 14A. A differential spectrum was obtained by measuring the IR absorption spectrum of both film and obtaining the difference between the two spectrums. The film having a poor waterproofing property showed a large amount of absorption ascribable to vibration energy of O—H bonds at a wave number near 3,600 $cm^{-1}$ while the film having a good waterproofing property showed a large amount of absorption ascribable to vibration energy of Si—O—Si bonds at a wave number of 1,106 $cm^{-1}$. The $SiO_2$ film formed by the process of the present invention contains less O—H bonds but more Si—O—Si bonds, and because of this feature the film has a high waterproofing property.

Figure 14B:
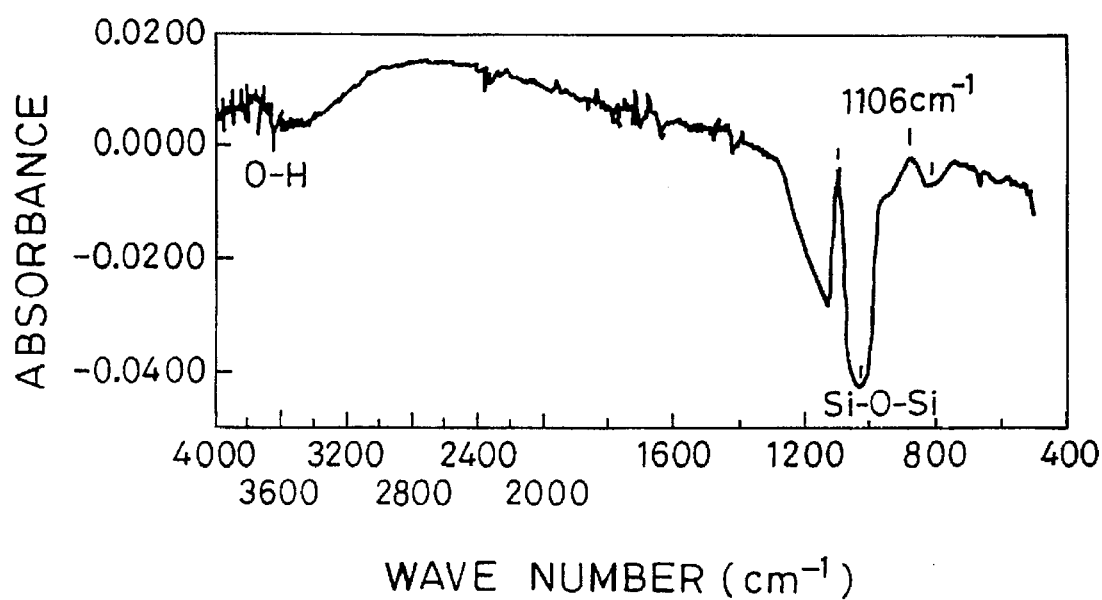
FIG. 14B is a diagram illustrating an infrared absorption spectrum, indirectly indicating a difference in the waterproofing property between the case where a film formation temperature was 300° C. and a case where it was 100° C., with the films being formed with the cusp plane positioned at an infinite distance from the rear side of the substrate.

Investigations made by the present inventors revealed that the factors governing the aforementioned feature can be obtained also by controlling the film formation temperature. FIG. 14B is a diagram illustrating an infrared absorption spectrum, indirectly indicating a difference in the waterproofing property depending on the position of the cusp plane and the film formation temperature according to one embodiment of the process of the present invention in which the film formation was performed with the cusp plane positioned at an infinite distance from the rear side of the substrate, with the film formation temperature being 300° C. in one case and with it being 100° C. in another case 100° C. Tests on the aforementioned waterproofing property revealed that at a film formation temperature of 300° C. the waterproofing property was 70% (in the case of using PSG), and it was confirmed that the film was inferior to the film formed by the process of the present invention.

The temperature at the time of film formation, i.e., 240° to 260° C., when using a cusp-shaped magnetic field in combination with RF power according to the present invention, is different by at most 20° C. from the film formation temperature in a diverging magnetic field. Also, it was confirmed that the difference in the waterproofing property is more than a mere effect of the temperature at the time of film formation, but is due to a different phenomenon independent thereof.

In the waterproof tests, it was found that a the film formed by the conventional RF plasma CVD process showed an anti-permeability or waterproofing property of 40% or lower for 40 hours' retention in the oven even when the substrate was heated to about 350° C. during film formation. From this it follows that an $SiO_2$ film formed by the process of the present invention has a high antipermeability.

Figure 3:
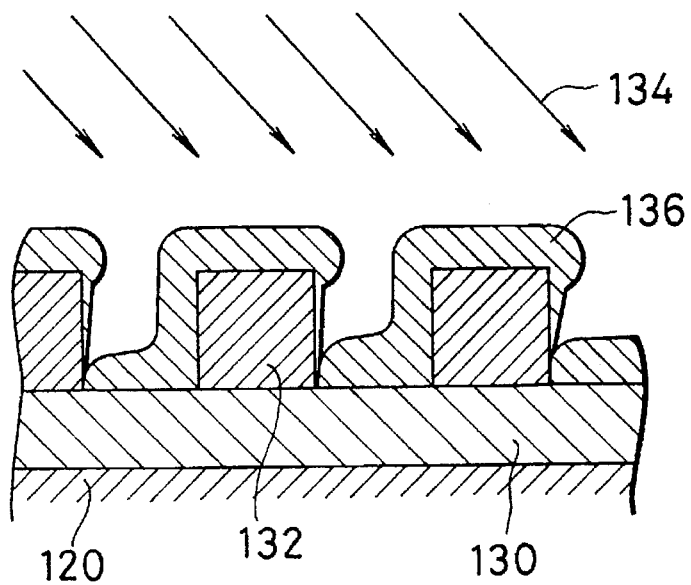
FIG. 3 is a schematic cross sectional view showing the state of coverage at stepped portions when a film is formed in the presence of a cusp-shaped magnetic field by a conventional process.
Figure 15:
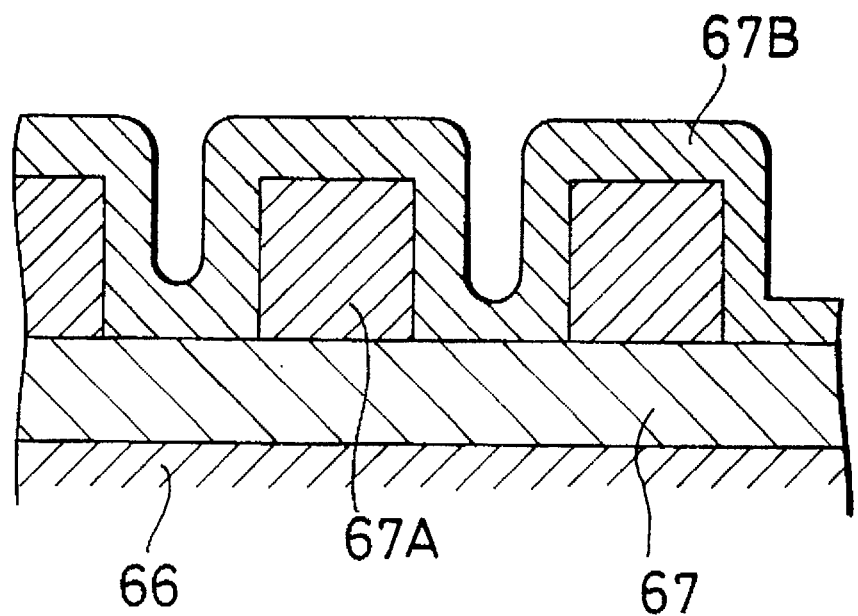
FIG. 15 is a schematic view showing the state of coverage at stepped portions when a film is formed by the process according to one embodiment of the present invention.

Furthermore, since the plasma density at the front side of the substrate is rendered uniform by increasing the gas pressure and applying RF power as described above, the internal stress in the film (which is generated when ions in the plasma that have been accelerated by the negative bias potential created on the surface of the substrate impinge upon the film) and the fineness of the film (which is a decisive factor defining the acid resistance on the film) are rendered more uniform. In addition, a bias sputtering effect due to a self-biasing effect is also retained. Furthermore, when a cusp-shaped magnetic field is created in the vicinity of the substrate, the ions in the plasma move along the magnetic field created by the excitation solenoid coaxially surrounding the plasma generation chamber and thus have inertia. Due to this inertia, the tracks of the ions are along the magnetic field and impinge on the substrate at its peripheral portion obliquely as shown in FIG. 3 at a gas pressure of $10^{-3}$ to $10^{-4}$ Torr as conventionally used. When stepped portions are to be covered, this results in the occurrence of shadows on the back side surfaces of the stepped portions where film grows poorly so that uniform coverage cannot be obtained. On the contrary, in the present invention, the use of a higher gas pressure (as high as $10^{-1}$ to $10^{-3}$ Torr) reduces the mean free path of the ions, which means that the influence of the magnetic field on the ions is reduced. As a result, oblique impingement of the ions in the plasma on the substrate does not occur. That is, as shown in FIG. 15, there is formed over the whole surface of a substrate, i.e., the whole surface of a construction including a PSG film 67 formed on an Si substrate 66 and aluminum (AL) wiring patterns 67A arranged on the PSG film 67, a thin film 67B of substantially uniform thickness, thus provided good step coverage.

When a cusp-shaped magnetic field is created in the vicinity of the substrate so that the cusp plane can be positioned at a distance within a range of 10 cm from the film formation surface of the substrate, a synergistic effect between the horizontal component of the cusp-shaped magnetic field and the RF electric field vertical thereto is obtained, which effect increases the density of the plasma, thus forming a thin film having a good anti-permeability or waterproofing property.

As an approach for obtaining a uniform plasma density, a conventional ECR plasma CVD apparatus includes a subsolenoid for providing a uniform plasma density, and a third magnetic pole for directing the magnetic flux so as to enter the substrate vertically (Japanese Patent Application Laid-Open No. 222437/1989). However, in such a conventional apparatus, severe precision is required in the control of the magnetic flux density or intensity of the magnetic field, and it is difficult in practice to obtain stable operation with the apparatus. On the contrary, the precision in the control of the magnetic flux density or intensity of the magnetic field required in the present invention is on the order of about 5 to 10% because the coil is at a distance of 10 cm or more, which makes it possible to control the magnetic flux density with a precision of about 1% with a commercially available coil power source.

Figure 16:
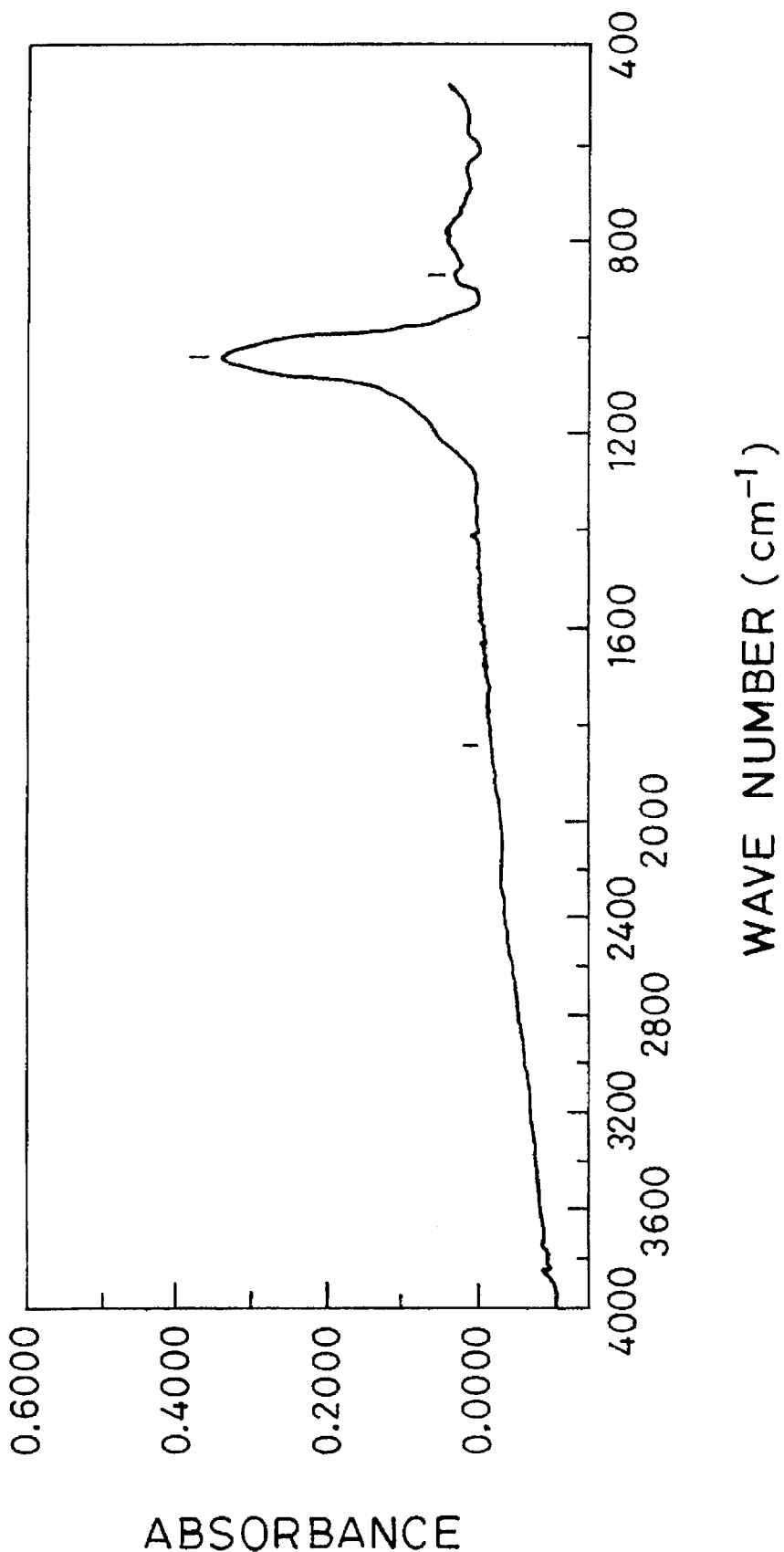
FIG. 16 is a diagram illustrating an infrared absorption spectrum, indirectly indicating the waterproofing property of a film formed by the process according to one embodiment of the present invention in which the film formation is performed at a gas flow rate ratio $O_2/SiH_4$ of about 1.

In the case where silicon oxide films are formed without creation of a cusp-shaped magnetic field, plasma is not activated by the synergistic effect between the RF electric field and the cusp-shaped magnetic field, and therefore only a slight excess of $O_2$ gas tends to result in the uptake of water by the resulting film. However, the supply of $O_2$ gas and $SiH_4$ gas at a flow rate ratio of 1±0.2 can give rise to a thin film having a refractive index of 1.47 to 1.52 and containing no O—H bonds (cf. FIG. 16, which illustrates the IR spectrum of the film). The film thus obtained has good properties relative to fineness, internal stress, and waterproofing property of the film. In this case, a film having a good waterproofing property can be formed at a film formation temperature of 250° C. or higher. When a cusp-shaped magnetic field is used in combination with RF power, the waterproofing property of the resulting film will show no deterioration when the film is formed at a film formation temperature of 150° C. or higher, the growth rate of the film is high, and a film having a narrow film thickness distribution can be formed depending on the gas pressure.

Also, when a cusp-shaped magnetic field is used in combination with RF power and when a flow rate ratio between $O_2$ and $SiH_4$ (i.e., $O_2/SiH_4$) of 1.5 or more is used, a film formed at 150° C. or higher has a refractive index of 1.44 to 1.49, which film also has good values relative to the fineness of the film, internal stress, and the waterproofing property. In the aforementioned range of the flow rate ratio, $O_2/SiH_4$, of 1±0.2, the dominant parameter controlling the film quality is a parameter other than the flow rate ratio.

Figure 17A:
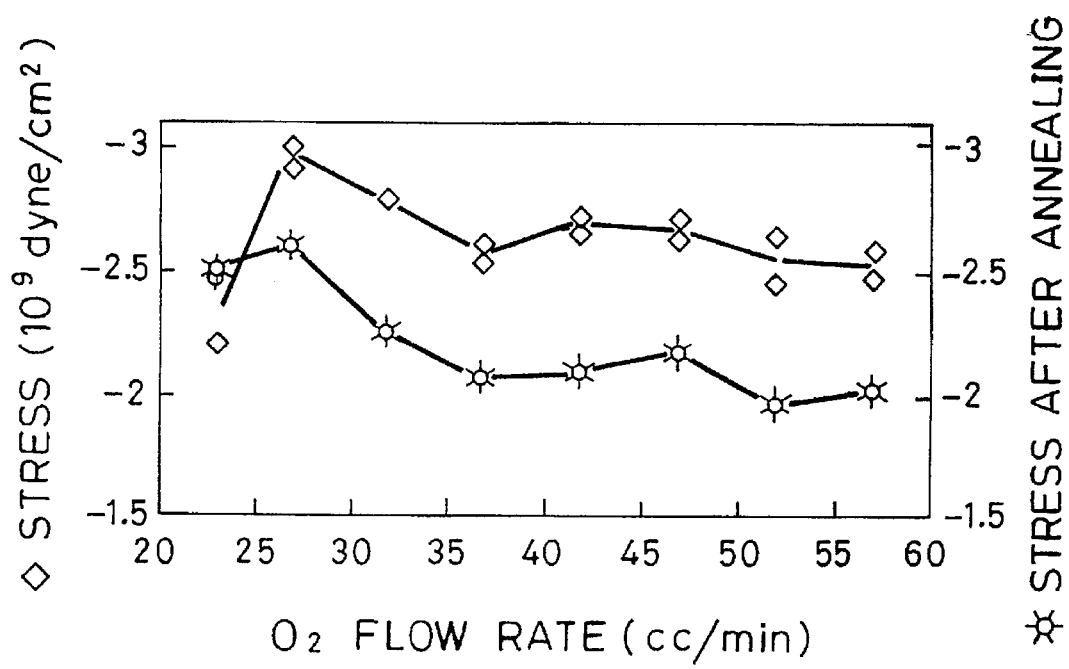
FIG. 17A is a graph illustrating how the film quality depends on the $O_2$ gas flow rate when the film formation temperature is set at about 260° C., the flow rate of $SiH_4$ gas is fixed at 23 SCCM, and the flow rate of $O_2$ gas is varied, the graph indicating a change in stress before and after annealing, respectively, against the flow rate of $O_2$ gas.
Figure 17B:
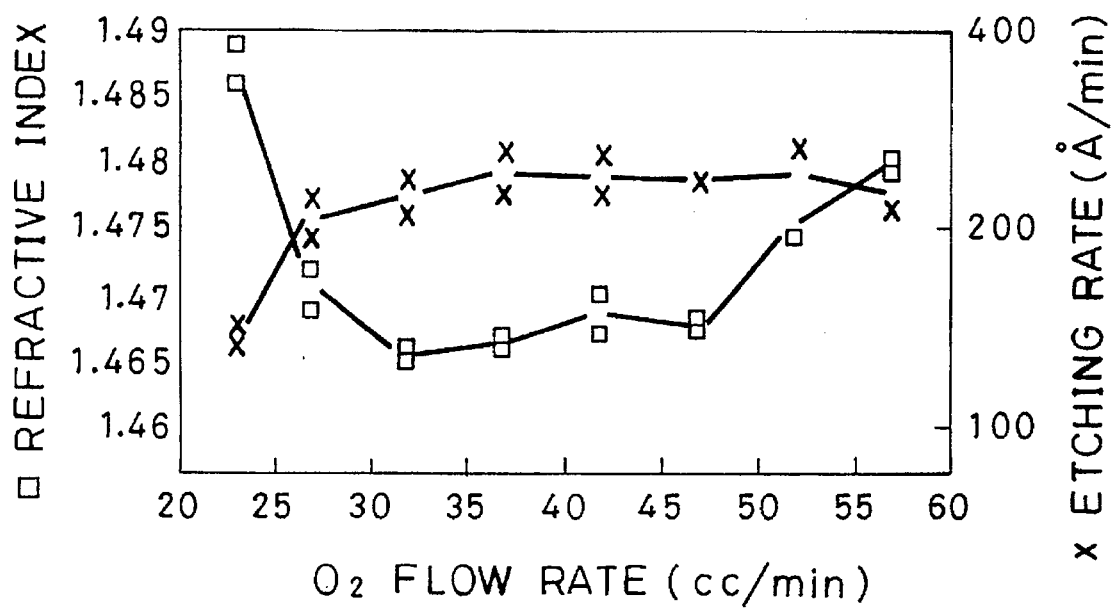
FIG. 17B is a graph illustrating how the film quality depends on the $O_2$ gas flow rate when the film formation temperature is set at about 260° C., the flow rate of $SiH_4$ gas is fixed at 23 SCCM, and the flow rate of $O_2$ gas is varied, the graph indicating a change in the refractive index and the etching rate of the film, respectively, against the flow rate of $O_2$ gas.

FIGS. 17A and 17B are graphs illustrating how the film quality depends on the $O_2$ gas flow rate when the film formation temperature is set at about 260° C., the flow rate of $SiH_4$ gas is fixed at 23 SCCM, and the flow rate of $O_2$ gas is varied. FIG. 17A illustrates the change in stress with respect to the flow rate of $O_2$ gas while FIG. 17B illustrates the change in the refractive index of the film with respect to the flow rate of $O_2$ gas. As will be apparent from FIGS. 17A and 17B, near an $O_2$ flow rate of 25 SCCM there exists only a single point at which the internal stress of the film shows no change before and after annealing. Only at this flow rate ratio, the film quality shows no change after annealing and thus a good quality film can be obtained. From this it can be understood that the flow rate ratio is a factor controlling the film quality. A film having a poor waterproofing property contains a large number of O—H bonds and releases water with annealing to decrease stress after annealing, which means no change in the stress after annealing is an important index.

When the film quality is secured by application of a cusp-shaped magnetic field at a flow rate ratio higher than 1.5, the refractive index, stress, and etching rate of the film show relatively small changes, respectively, at an $O_2$ flow rate of 33 SCCM or higher as illustrated in FIGS. 17A and 17B. This is because the amount of $O_2$ consumed during the reaction is substantially equivalent to the amount of $SiH_4$, and oxygen gas is excessive at a flow rate ratio of 1.5 or more while the pressure in the plasma reaction chamber is controlled to be at a constant level, with the result being that the excess of $O_2$ partial pressure is not influenced by a change in flow rate ratio. Pressure control in a process where excessive $O_2$ is present, unlike the case of the aforementioned flow rate ratio, can give rise to a stable film quality over a wide range of $O_2$ flow rates, which makes stable operation of the apparatus possible, thus increasing the reliability of LSI fabrication.

In this case, the factor controlling the film quality in the process is the film formation temperature. It has been confirmed by the present inventors that at a temperature within the range of 150° to 300° C., the aforementioned refractive index range is changed monotonically and concomitantly the etching rate increases slightly as the temperature increases.

According to the present invention, an apparatus for forming a silicon oxide film at a gas pressure of $7\times10^{-3}$ to $1\times10^{-1}$ Torr, with RF power being applied and with or without a cusp-shaped magnetic field, can include an electrostatic chuck. The surface of the substrate holder on which a substrate is mounted or held serves as the attraction surface of the electrostatic chuck. In this arrangement, the substrate can be held in full contact with the overall attraction surface of the electrostatic chuck due to an electrostatic attracting force so that good heat conduction can be achieved between the substrate and the electrostatic chuck. Hence, unlike the case of contact heat conduction utilizing the weight of the substrate itself, as is usual where the temperature of the substrate depends on the energy of plasma impinging on the substrate, there is no need to increase the flow rate of $SiH_4$ gas and also to increase the RF power accordingly in order to increase the growth rate of the film. In order to increase the growth rate of the film, it is sufficient to control the temperature of the stage of the substrate holder to which the electrostatic chuck is fixed by an appropriate means independently of the RF power.

Since RF power is supplied to the substrate through the insulating layer of the attraction electrode of the electrostatic chuck, a substrate holder having a stage to which an electrostatic chuck is fixed constitutes by itself a substrate holder to which RF power can be applied, and hence there is no need for a condenser between the stage and the RF power source.

In an apparatus for forming a silicon oxide film under the conditions that a gas pressure of $7\times10^{-3}$ to $1\times10^{-1}$ Torr is used, RF power is applied and a cusp-shaped magnetic field is employed, the magnetic field can be adjusted to increase the waterproofing property of the film that is produced. In particular, if the subsolenoid 68 which cooperates with the excitation solenoid 40 to create the cusp-shaped magnetic field is arranged in such a manner that the top of the subsolenoid is spaced a part from the surface of the substrate on which film is to be formed by 10 cm or more, then the cusp plane of the cusp-shaped magnetic field can be positioned within a range of from 10 cm above to 10 cm below the surface of the substrate on which film is to be formed by adjusting the current supplied to the subsolenoid in order to effectively increase the waterproofing property of the resulting silicon oxide film.

In an apparatus for forming a silicon oxide film, a valve for closing or opening the exhaust pipe from the plasma reaction chamber and a variable orifice parallel to the valve may be provided. For example, a plate-like valve which can close the passage of the exhaust pipe over all its cross sectional area may be arranged in the passage of the exhaust pipe, the valve being rotatable around its axis. The opening of the valve may be controlled by detecting the pressure inside the apparatus and feeding it back to the valve. The use of the valve and the variable orifice in combination makes it possible to obtain a desired pressure in the apparatus with ease and high precision.

Also, it is possible to provide a gas inlet port midway in the exhaust pipe from the plasma reaction chamber and to supply the same gas as that introduced into the plasma generation chamber, $N_2$ gas, or inert gas to the exhaust pipe through the gas inlet port. By so doing, a portion of the fluid discharged by a vacuum exhaust device having a constant discharge ability is occupied by the gas introduced into the exhaust pipe through the gas inlet port. This reduces the amount of gas discharged from the apparatus to increase the pressure inside the apparatus or the plasma reaction chamber. Furthermore, the degree of increase in the pressure inside the apparatus can be changed by controlling the amount of the gas introduced into the exhaust pipe through the gas inlet port. Therefore, the gas pressure can be set and maintained at a desired value smoothly and automatically by detecting the gas pressure inside the ECR plasma CVD apparatus and controlling the amount of gas introduced through the gas inlet port by feedback control.

If a vacuum pump with a discharge ability which depends on the rotational frequency or speed of the vacuum pump is used for evacuating the apparatus, a control device can be provided to make it easy to control the gas pressure inside the apparatus. The desired pressure value can be obtained with ease and high precision by detecting the gas pressure inside the apparatus and controlling the rotational speed of the vacuum pump by feedback control.

Furthermore, a gas inlet port may be provided in the conduit for supplying plasma raw gas to the plasma generation chamber or in a wall of the plasma generation chamber in order to supply Ar gas to the conduit or the plasma generation chamber. This construction enables the introduction of Ar gas having a strong etching activity necessary for achieving good step coverage or for forming a flat surface upon covering stepped portions such as wiring on the substrate. Along with the effect of high gas pressure, this construction enables the efficient formation of interlayer insulation films.

Also, gas inlet ports for supplying phosphine and diborane, respectively, may be provided in the conduit for introducing the reactive gas into the plasma generation chamber. This construction makes it possible to perform uniform doping of P and B, respectively, with ease, taking advantage of the effect of high pressure film forming.

Figure 18:
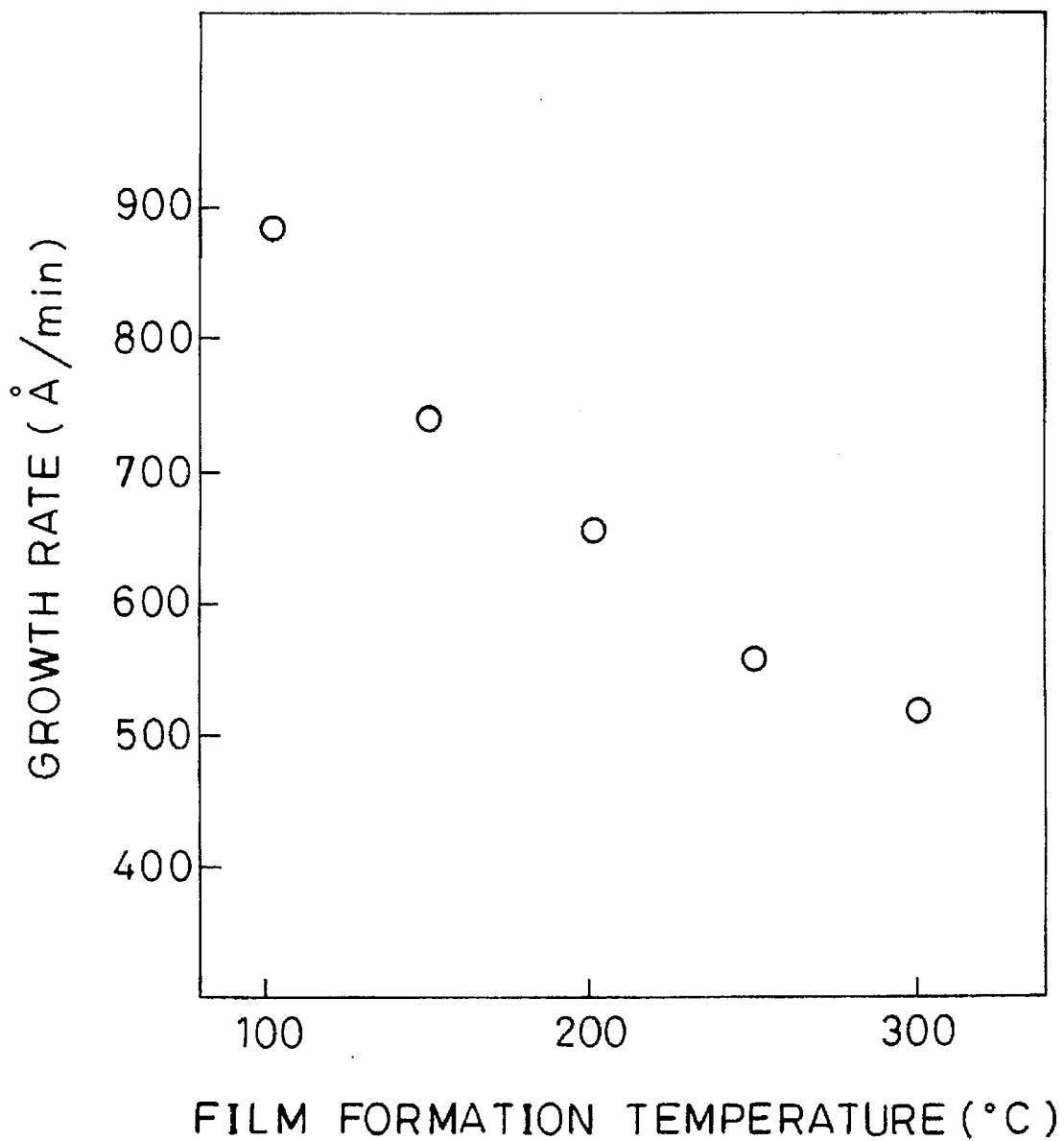
FIG. 18 is a graph illustrating film formation temperature characteristics during formation of a silicon oxide by the process of the invention.

FIG. 18 is a graph illustrating film formation temperature characteristics when a silicon oxide film is formed by the process of the invention. The mechanism of film formation is as follows. First, $SiH_4$ gas released from the gas distributors collides with plasma particles to activate the particles, which in turn impinge on the surface of the substrate and have a probability for reaction therewith so as to form a film. The dependence of the reaction probability on temperature is higher at a lower temperature since the reaction is exothermic. The theory of the film formation reaction corresponds well to the experimental results shown in FIG. 18, suggesting that the theory is correct. In the film formation process of the present invention, when the temperature of the substrate is 150° C. or higher, the resulting film contains fewer O—H bonds and has a high waterproofing property. Taking into consideration the aforementioned results, it is believed that the use of a relatively low film formation temperature enables film formation at a high rate, and that film formation in the vicinity of 300° C. gives rise to films having higher waterproofing properties, thus making it possible to operate the apparatus in accordance with the purpose.

When a silicon oxide is film is formed at a temperature below 150° C., moisture produced during the reaction of silane with an oxygen source gas such as $O_2$ as $N_2O$ is contained in the resulting film in the form of O—H bonds in a certain proportion. This decreases the waterproofing property of the film. In the process of the present invention, the substrate holder may be formed to allow the circulation of a heat transfer medium therein so that its temperature can be controlled within the range of 150° to 300° C. This prevents the takeup of moisture by the film and thus the variation of internal stress of the film by annealing. As a result, films having high waterproofing properties can be formed and the lifetime of LSI products can be prolonged. The temperature range used is below a temperature of 300° C., at which temperature hillocks arise on wiring patterns on the substrate. In this sense, too, the present invention is useful in the fabrication of LSI products having high reliabilities.

Figure 19:
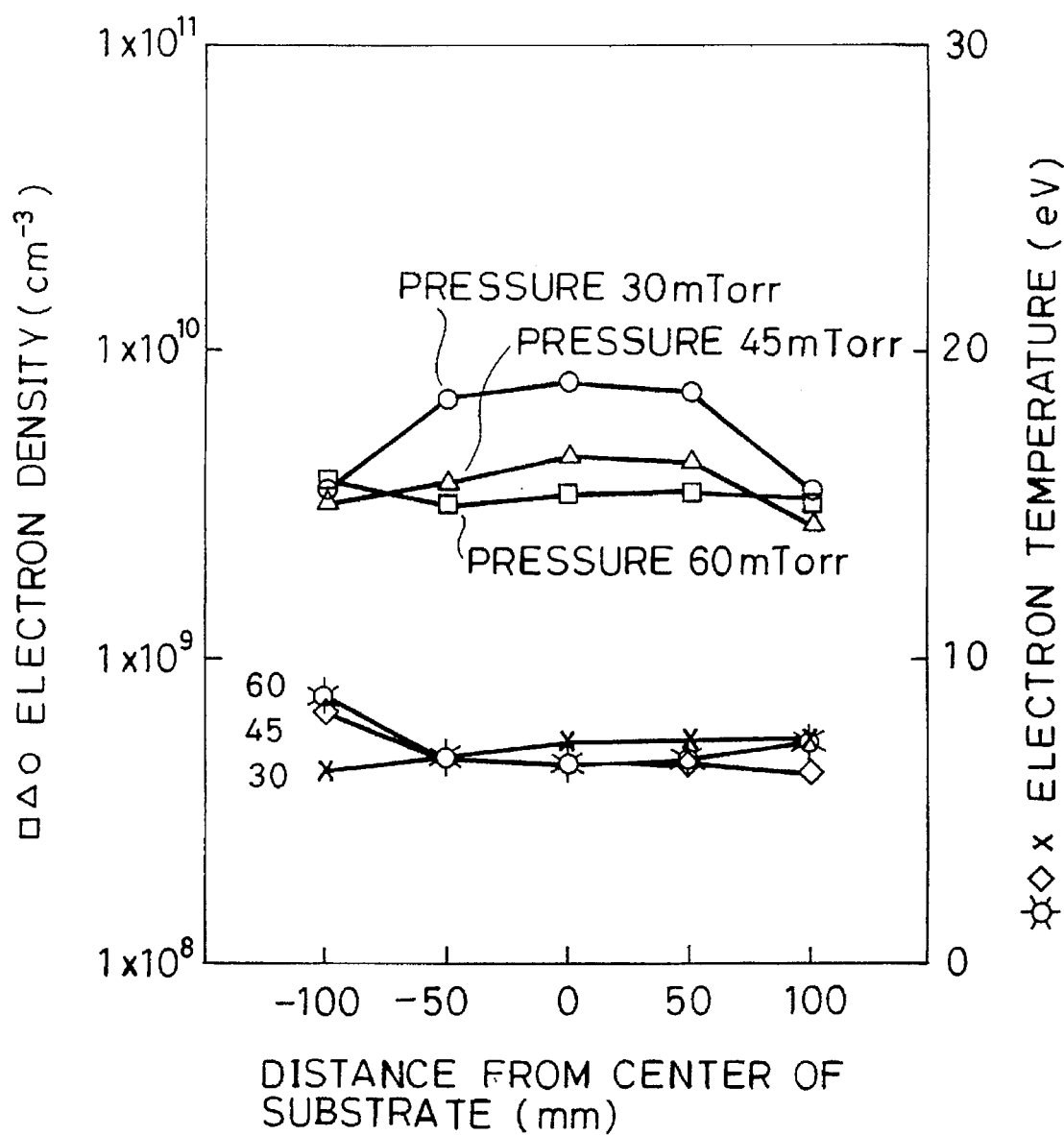
FIG. 19 is a graph illustrating the distribution of the electron density and the distribution of the electron temperature at the surface of the substrate during film formation by the process of the present invention, using the gas pressure as a parameter.

Of course, a means for uniformly generating gas is used in the present invention in order to obtain a uniform film thickness distribution. As disclosed in Japanese Patent Application Laid-Open No. 14223/1991, the conventional apparatus uses an auxiliary coil for creating a cusp-shaped magnetic field to supplement the uniformity of microwave plasma in a pressure region within the range of $10^{-3}$ to $10^{-4}$ Torr. On the contrary, in the pressure region used in the present invention, a complex or mixed plasma composed of microwave plasma and RF plasma is obtained, and the plasma density can be rendered uniform as illustrated in FIG. 19 by controlling the pressure without controlling the magnetic field by means of an auxiliary coil.

However, in the present invention, the uniformity in the plasma density is not so important. As will be clear from FIG. 8, which illustrates film thickness profiles, the film thickness in the center of the substrate decreases when the pressure is increased. On the other hand, measurement of the plasma density revealed that the plasma density is not lower in the central portion. From these considerations it follows that in the pressure region used in the present invention, the plasma density contributes to the film thickness distribution to a lesser extent than other parameters.

In the lower pressure region, the probability that $SiH_4$ molecules will collide with $O_2$ molecules is relatively low and many unactivated $SiH_4$ molecules can exist in the space in the apparatus. The reaction probability depends on the plasma density distribution, and the film growth rate is proportional to the reaction probability. In this manner, the film thickness distribution depends on the plasma density. Thus, if the plasma density increases, the film growth rate increases.

In the pressure region used in the present invention, the probability that $SiH_4$ molecules will collide with $O_2$ molecules is high, and the reaction to activate the gases is initiated readily when the plasma density exceeds a certain value. In this case the dominating factor for the reaction probability is the concentration distribution of $SiH_4$ gas but not the plasma density. Hence, at an increased pressure, the probability in which $SiH_4$ gas molecules collide increases, resulting in a reduction in the number of the $SiH_4$ gas molecules which can travel from the peripheral wall of the plasma reaction chamber and reach the central portion thereof, which gives rise to a decreased film growth rate in the central portion.

As described above, it is important that $SiH_4$ gas is blown or ejected uniformly in order to obtain a uniform film thickness distribution in the pressure region used in the present invention.

The shortest distance between the gas inlet ports for ejecting $SiH_4$ and the substrate needs to be at least 5 cm. If the distance is shorter than 5 cm, the thickness of the film on the peripheral portion of the substrate is greater than other portions and the correction effect of the pressure becomes useless.

Figure 20A:
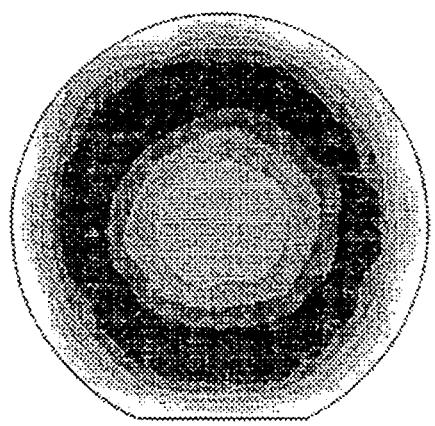
FIG. 20A is a contour plan diagram illustrating how a uniform distribution of a reactive gas in the plasma reaction chamber effects film formation by the process of the present invention, and indicates the film thickness distribution when the distribution of the reactive gas is uniform in the peripheral direction.
Figure 20A:
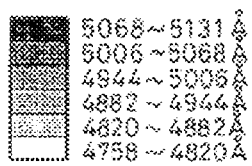
Figure 20B:
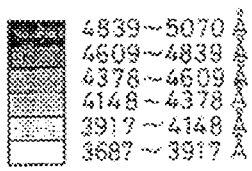
FIG. 20B is a contour plan diagram illustrating how a non-uniform distribution of a reactive gas in the plasma reaction chamber effects film formation, and indicates the film thickness distribution when the distribution of the reactive gas is non-uniform by about 1/10 in the peripheral direction.
Figure 20B:

FIGS. 20A and 20B each show a contour plan diagram illustrating the relationship between the uniformity in the distribution of a reactive gas in the plasma reaction chamber and film formation by the process of the present invention. FIG. 20A indicates the film thickness distribution when the distribution of the reactive gas is uniform in the peripheral direction, and FIG. 20B indicates the film thickness distribution when the distribution of the reactive gas is nonuniform by about $\frac{1}{10}$ in the peripheral direction.

More specifically, $SiH_4$ gas was introduced horizontally from twelve gas inlet ports 46B arranged uniformly at the same height and at the same distance one from another in the peripheral wall 46A of the plasma reaction chamber. When one of the twelve gas inlet ports was closed and the same amount of gas was ejected through each of the remaining eleven ports, the distribution of the $SiH_4$ gas became nonuniform as illustrated in FIG. 20B. The results of the experiment indicate that if the precision of gas ejection is reduced by about $\frac{1}{12}$, the increase in the film thickness distribution exceeds 10%.

Accordingly, in the pressure region of $10^{-1}$ to $10^{-3}$ Torr, it is important for the precision of gas ejection to be within the range of 10% or less with respect to both direction and quantity. In other words, the film formation mechanism of the process of the present invention is different from that of the conventional technique disclosed in Japanese Patent Application Laid-open No. 14223/1991.

When the flow rate of $SiH_4$ gas is increased in order to increase the film growth rate, with the flow rate of oxygen gas being maintained at a constant level, the probability that $SiH_4$ gas molecules will reach the center of the substrate does not change and the central portion has a relatively larger thickness. To correct this non-uniformity in film thickness it is necessary to increase the gas pressure. However, when the gas pressure is increased, voids tend to occur when stepped portions are covered, at the bottoms thereof. This disadvantage can be overcome by increasing the flow rate of $O_2$ gas as the flow rate of $SiH_4$ gas increases, in the same proportion as that of the $SiH_4$ gas, so that the flow rate ratio $SiH_4/O_2$ is maintained at a substantially constant value. As a result, the partial pressure of the $SiH_4$ can be increased gradually to obtain an optimum pressure with ease, which enables the film thickness distribution to be optimized.

EXAMPLES

Hereafter, the present invention will be described in more detail by examples. However, the present invention should not be construed as being limited thereto.

Example 1

An apparatus for forming a silicon oxide film having the construction shown in FIG. 4 was produced. The opening of the variable orifice 84 was adjusted by the feedback circuit 82 so that the pressure inside the apparatus could be controlled freely within the range of 0.1 to 100 mTorr.

The apparatus was provided with a gas distributor device having a cross sectional area of about 30 $cm^2$. Twelve gas outlet ports 56 were arranged uniformly in the peripheral direction along the ring of the gas distributor device at the same distance one from another. The pressure difference between the inside and the outside of the gas distributor device was set to 50 mTorr. The inner diameter of the ring of the gas distributor was about 350 mm. Silane ($SiH_4$), phosphine ($PH_3$), and diborane ($B_2H_6$) from the gas sources 52A, 52B and 52C, respectively, were introduced into the plasma reaction chamber through the conduits 54A, 54B and 54C, respectively.

Example 2

This example explains the process for forming a silicon oxide film using the cusp-shaped magnetic field ECR plasma CVD apparatus described in EXAMPLE 1 above. Microwave was introduced into the plasma generation chamber 38 through the waveguide 34 and the waveguide window 36. The microwave energy had a frequency of 2.45 GHz, and was generated by applying a power of 0.5 to 1.5 kW. The excitation solenoid 40 created a magnetic flux of 875 gauss in the plasma generation chamber 38. Under these conditions, $O_2$ gas at a flow rate of 16 to 250 SCCM was introduced into the plasma generation chamber 38 through the first gas supply conduit 42 to generate plasma. The plasma was drawn out into the plasma reaction chamber 46 by the action of a diverging magnetic field created by the excitation solenoid 40. Silane ($SiH_4$) gas was supplied into the plasma reaction chamber 46 through the second gas supply conduit 50 at a flow rate of 20 to 50 SCCM. The gas molecules travelled toward the substrate 66 on the substrate holder 60 while they were being decomposed or ionized by the energy of the plasma, and reached the surface of the substrate 66 (having a diameter of 8 inches) in a cusp-shaped magnetic field created in the vicinity of the substrate holder 60 by the excitation solenoid 40 and the subsolenoid 68. RF power at 13.56 MHz was applied to the substrate holder 60, with the power being within the range of 100 to 1,000 W. The apparatus was evacuated through the exhaust pipe 76 so that the pressure inside the plasma reaction chamber 46 could be adjusted within the range of 5 to 100 mTorr. Further, the apparatus was operated using the variable orifice 84 and the feedback circuit 82 in combination. Instead of $O_2$ gas, $N_2O$ or a mixed gas composed of $N_2$ and $O_2$ may also be used. Silicon oxide films were formed using the aforementioned apparatus and varying various film formation conditions within the ranges specified above and set forth in Table 1 below.

TABLE 1

| Film Formation Conditions | |
| --- | --- |
| Gas pressure | 5 to 100 mTorr |
| Microwave power | 0.5 to 15 kW |
| RF power | 100 to 1,000 W |
| Gas flow rate ratio | 0.8 to 2.5 |
| Temperature of substrate | 100 to 350° C. |

FIG. 7 illustrates an example of the dependence, on the film formation pressure, of the film thickness distribution of a silicon oxide film formed under the conditions within the ranges set forth above and at a film growth rate of 500 Å/minute or higher. In this case, a change in the intensity of the magnetic field created by the subsolenoid gives substantially no change in the film thickness distribution. The film formation pressure range which gives a film thickness distribution of 5% or lower has a minimum value within the range of $7\times10^{-3}$ to $1\times10^{-1}$ Torr. The pressure region giving a good film thickness distribution is relatively broad, allowing a process margin of about 5 mTorr (i.e., about $\Delta 5$ mTorr). On the other hand, the precision of pressure control of the apparatus is ±0.5 mTorr (i.e., $\Delta 1$ mTorr). Thus, the allowance of the former is about five times as large as the latter.

The details of films formed under the conditions illustrated in FIG. 7 are illustrated in FIG. 8. FIG. 8 shows profiles of film thickness distribution at a low pressure, an optimum pressure, and a high pressure, respectively. As will be understood from FIG. 8, the film thickness profile at a low pressure is convex while at a high pressure, the film thickness profile is concave, and the film thickness distribution is optimal at a medium pressure.

When a film is formed under other conditions, for example, at an RF power different than above, the gas pressure which results in the minimum film thickness distribution varies. In other words, even though other conditions or parameters have been changed, the film thickness distribution can be minimized by controlling the gas pressure during film formation.

Figure 2:
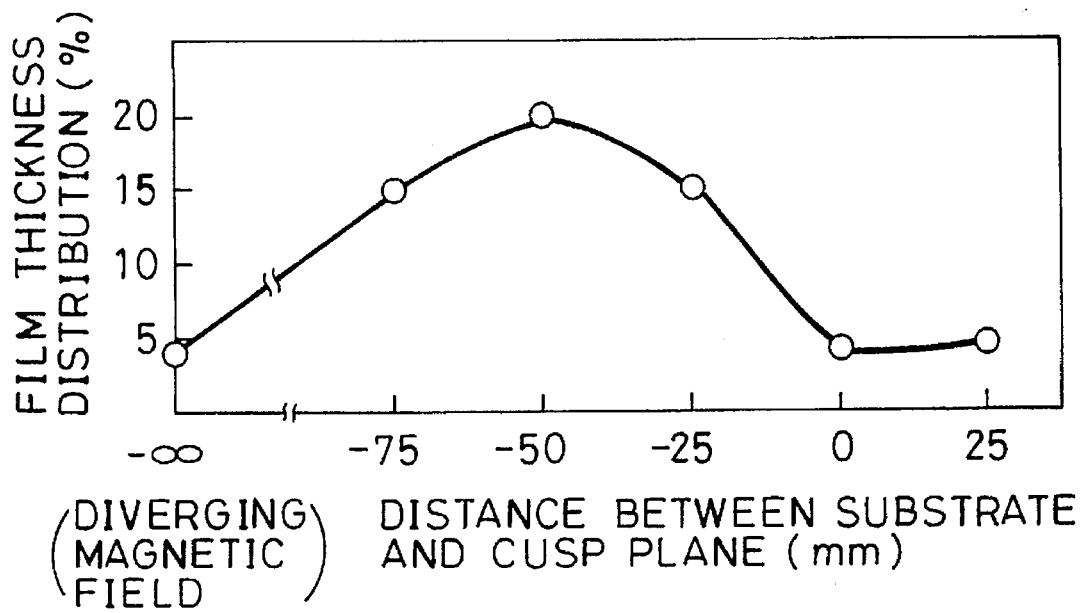
FIG. 2 is a graph illustrating the dependence, on the position of a cusp plane, of the film thickness distribution of a film formed on a substrate of 6 inches in diameter when a cusp-shaped magnetic field is created, high frequency power is applied, and a low gas pressure (1 mTorr) is used.
Figure 21A:
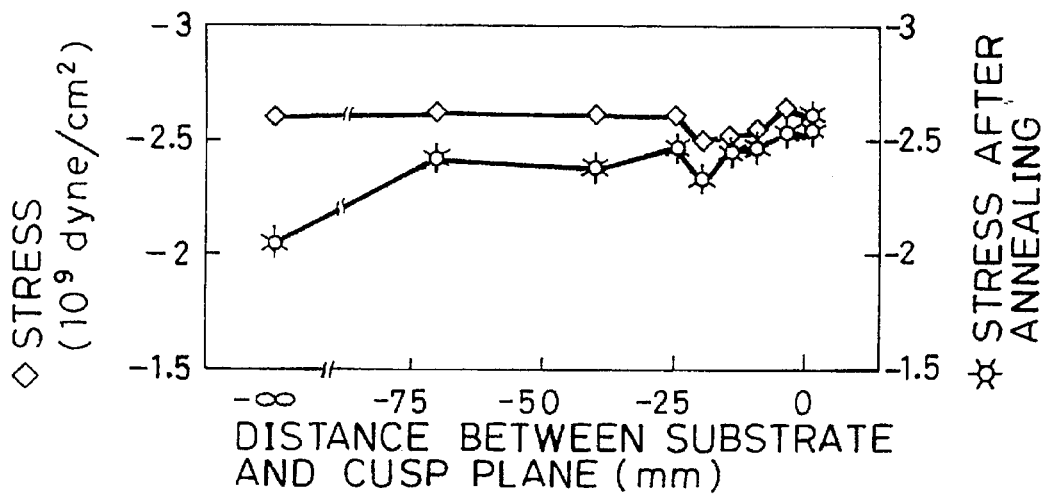
FIG. 21A is a graph illustrating how stresses in a film formed by the process of the present invention depend on the position of the cusp plane, after film formation and after annealing, respectively.
Figure 21B:
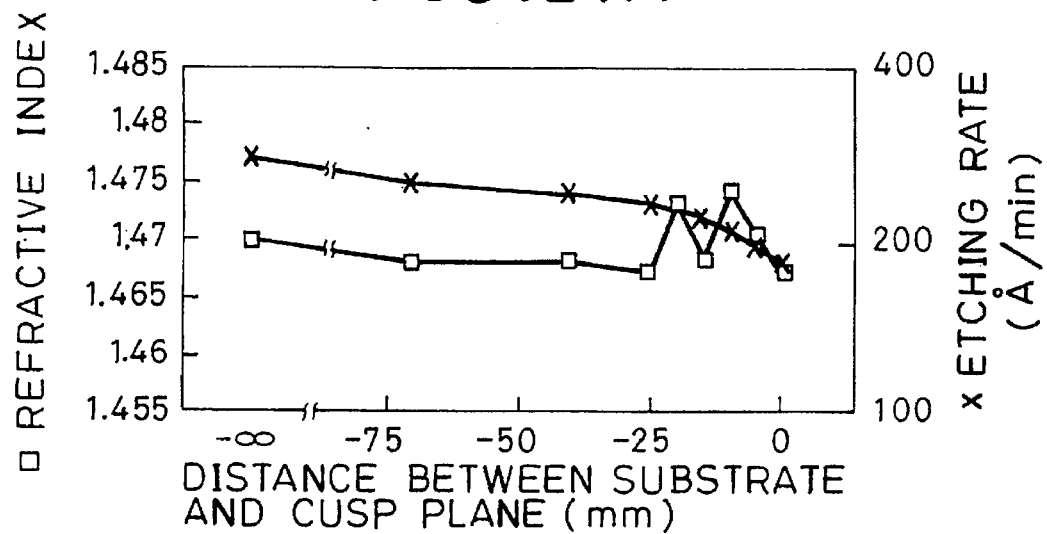
FIG. 21B is a graph illustrating how the refractive index and the etching rate, respectively, of a film formed by the process of the present invention depend on the position of the cusp plane.
Figure 21C:
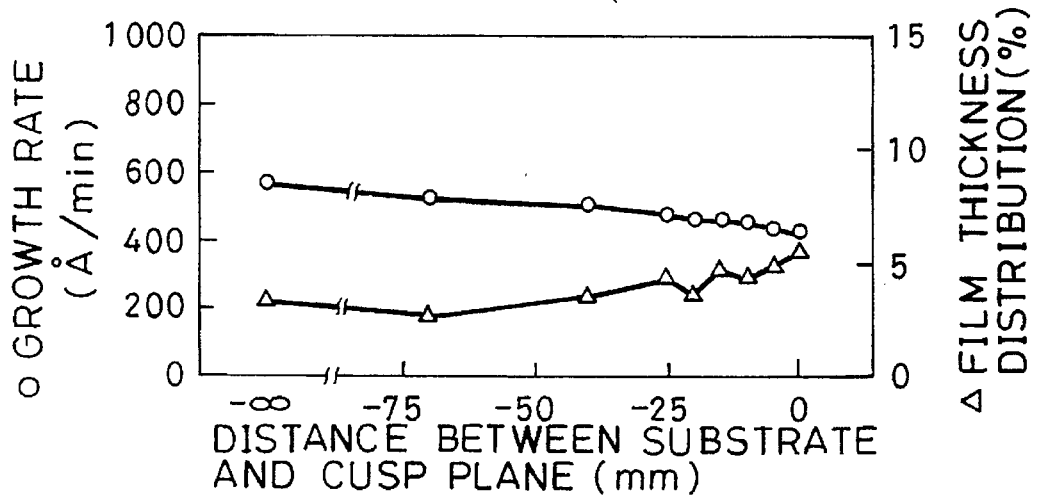
FIG. 21C is a graph illustrating how the growth rate and the film thickness distribution, respectively, of a film formed by the process of the present invention depend on the position of the cusp plane.

FIGS. 21A, 21B and 21C illustrate the characteristics of films formed by the process of the present invention at a film formation temperature of 230° C. FIG. 21A is a graph which illustrates changes in stress before and after annealing as functions of the distance between the substrate and the cusp plane; FIG. 21B is a graph which illustrates changes in the refractive index and the etching rate as functions of the distance between the substrate and the cusp plane; and FIG. 21C is a graph which illustrates changes in the film growth rate and the film thickness distribution as a function of the distance between the substrate and the cusp plane. The RF bias applied was 300 W. The horizontal axis indicates the distance between the substrate and the cusp plane. The pressure at the time of film formation was 37 mTorr. In contrast to the film thickness distribution characteristics in the case of low pressure (on the order of up to 1 mTorr) as illustrated in FIG. 2, a film formed under the aforementioned conditions has a film thickness distribution showing no significant dependence on the position of the cusp plane. The etching rates plotted in FIG. 21B were obtained using diluted hydrofluoric acid solution as an etchant at a solution temperature of 29° C. The silicon oxide film formed by the process of the present invention whose characteristics are illustrated in FIG. 21B shows an etching rate of 300 Å/minute, which is lower than the etching rate for a film formed by the conventional RF plasma CVD process (350 Å/minute), and has an adequately high resistance to acid. That is, the film quality of a silicon oxide film formed by the process of the present invention was revealed to be as good as a film formed at a low pressure by the conventional process. Also, it was confirmed that the film thickness distribution is ±10% or narrower, and uniformity in the film quality was secured.

The refractive index, n, in FIG. 21B fluctuates within the range of precision of the measuring device used, and the refractive index of the film is substantially constant regardless of the position of the cusp plane. The stress of the film is varied little by annealing when a cusp plane is created at a distance of 25 mm or less from the substrate. This region of distance corresponds to the region in which the film has a good waterproofing property (cf. FIG. 11).

The step coverage of the aforementioned silicon oxide film was evaluated by forming a silicon oxide film on the surface of a substrate on which wiring patterns having a width of 0.3 to 2 µm and a height of 1 µm were formed, and then observing the film under a scanning electron microscope. As a result, it was confirmed that the form of the silicon oxide film on the portions with wiring patterns was improved sufficiently by the application of an RF power of 300 W or higher. Even when a cusp-shaped magnetic field is created in the vicinity of the substrate, the inertia of the ions in the plasma, while they are moving along the magnetic field created by the excitation solenoid surrounding the plasma generation chamber, can be reduced by shortening the mean free path of the gas molecules with an increase in the gas pressure. As a result, there is substantially no oblique impingement of the ions on the substrate even in the peripheral portion of the substrate, thus providing good step coverage as illustrated in FIG. 15.

FIG. 11 illustrates the relationship between the waterproofing property of a film formed by the process of the present invention (left to stand for 100 hours) and the position of a cusp-shaped magnetic field. A film formed by the conventional RF plasma CVD process had a decreased waterproofing property, to the level of 40%, after being left to stand for 40 hours. According to the present invention, it is easy to obtain films having a waterproofing property at least 4 times higher than films obtained conventionally.

FIG. 5A and FIG. 5B are schematic cross sectional views showing the main parts of pressure control means in film formation apparatuses according to other embodiments of the present invention, the pressure control means differing from that used in the apparatus shown in FIG. 4. In the arrangement shown in FIG. 5A, $O_2$, $N_2$, or inert gas is introduced upstream of the vacuum pump 78 in order to control the pressure inside the plasma reaction chamber. On the other hand, in the arrangement shown in FIG. 5B, a control means for controlling the evacuation rate of the vacuum pump 78 is used in order to control the gas pressure inside the plasma reaction chamber.

Although not shown particularly, Ar gas may be added to $O_2$ gas in the arrangement shown in FIG. 4. Similarly to other ECR plasma CVD apparatuses, this enables leveled film formation due to an RF bias effect. In a conventional low pressure ECR, the addition of Ar gas results in a film thickness distribution of about 10% even for a 6-inch substrate, in a diverging magnetic field, and hence it is necessary to use a cusp-shaped magnetic field. However, in the presence of a cusp-shaped magnetic field, the contour of the film at its peripheral portions becomes non-uniform and voids tend to occur at the end or peripheral portions. Due to these problems, the resulting LSIs have low reliabilities. On the contrary, in the pressure region used in the present invention, the use of a cusp-shaped magnetic field does not necessarily result in the formation of a film having a contour which is non-uniform at the peripheral portions and LSIs having high reliabilities can be obtained at an increased film growth rate. Hence, according to the present invention there is no need for providing a step of improving the contour of the film at the peripheral portions and the film production efficiency of the apparatus increases.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An apparatus for forming a silicon oxide film, comprising:

microwave generation means for generating microwaves;

microwave transmission means for transmitting the microwaves generated by said microwave generation means;

a plasma generation chamber having a wall, said plasma generation chamber being in communication with said microwave transmission means and having gas supply means and an opening defined at an end portion in an opposing relationship with said microwave transmission means;

a first excitation solenoid, disposed around said plasma generation chamber in coaxial relationship therewith, for producing a magnetic field for generating plasma from gas introduced into said plasma generation chamber by a resonant effect with said microwaves;

a plasma reaction chamber for forming a silicon oxide film on a surface of a substrate disposed therein with said plasma, said plasma reaction chamber being in communication with said plasma generation chamber through said opening, and having a side wall, a substrate holder with a substrate holding surface on which the substrate is mounted, reactive gas supply means for supplying a reactive gas into said plasma reaction chamber, and gas exhaust means in communication with said plasma reaction chamber, said gas exhaust means having a vacuum pump;

a second excitation solenoid, disposed in an opposing relationship with said first excitation solenoid relative to the substrate, for producing a magnetic field whose polarity is opposite to that of the magnetic field produced by said first excitation solenoid so as to provide a cusp-shaped magnetic field in the vicinity of said surface of said substrate;

a power supply for applying high frequency power to the substrate; and pressure control means associated with said plasma reaction chamber for controlling gas pressure in said plasma reaction chamber wherein said second solenoid has an end opposing the surface of said substrate on which a silicon oxide film is to be formed, which end is disposed at a distance of 10 cm or more from the surface of said substrate on which a film is to be formed, so that said cusp-shaped magnetic field has a cusp plane in a region between a distance of 10 cm above the surface of said substrate on which a silicon oxide film is to be formed and a distance of 10 cm below the surface of said substrate on which a silicon oxide film is to be formed.

2. An apparatus for forming a silicon oxide film as claimed in claim 1, further comprising an electrostatic chuck provided in said substrate holder for attracting the substrate to the substrate holding surface of the substrate holder.

3. The apparatus for forming a silicon oxide film as claimed in claim 2, wherein said exhaust pipe is provided in a central region thereof with a gas inlet port for introducing into said exhaust pipe the same gas as that introduced in said plasma generation chamber, $N_2$ gas or inert gas.

4. The apparatus for forming a silicon oxide film as claimed in claim 2, further comprising controlling means connected to said vacuum pump for controlling the rotational speed of said vacuum pump to change the exhaustion ability of said vacuum pump.

5. The apparatus for forming a silicon oxide film as claimed in claim 2, further comprising a gas inlet port, in said gas supply means or in said wall of said plasma generation chamber, for supplying Ar gas thereto.

6. The apparatus for forming a silicon oxide film as claimed in claim 2, wherein said reactive gas supply means have gas inlet ports for supplying phosphine and diborane, respectively, to said reactive gas supply means.

7. The apparatus for forming a silicon oxide film as claimed in claim 2, further comprising heating means for heating said substrate at a temperature within the range of 150° to 300° C. at the time of film formation.

8. The apparatus for forming a silicon oxide film as claimed in claim 2, wherein said reactive gas supply means has gas ejection ports in said side wall of said plasma reaction chamber through which said reactive gas is ejected into said plasma reaction chamber, said gas ejection ports being disposed at a shortest distance of at least 5 cm from said substrate, with an ejection direction and an ejection flow rate of the gas flowing through each of said gas ejection ports being adjusted so that non-uniformity in distribution in a peripheral direction of the flow rate of the gas flowing toward the center of said substrate is within 10% of the total gas flow rate.

9. The apparatus for forming a silicon oxide film as claimed in claim 1, wherein said gas exhaust means comprises a gas exhaust pipe, communicating with said plasma reaction chamber, for exhausting gas in said plasma reaction chamber, and wherein said pressure control means comprises a valve disposed in said gas exhaust pipe for opening and closing said pipe, and a variable orifice having a variable gas passage area connected to said exhaust pipe parallel to said valve.

10. The apparatus for forming a silicon oxide film as claimed in claim 1, wherein said pressure control means comprises a gas inlet port, provided in a central region of said exhaust pipe, for introducing into said exhaust pipe the same gas as that introduced in said plasma generation chamber, $N_2$ gas or inert gas.

11. The apparatus for forming a silicon oxide film as claimed in claim 1, further comprising pressure control means connected to said vacuum pump for controlling the rotational speed of said vacuum pump to change the exhaustion ability of said vacuum pump.

12. The apparatus for forming a silicon oxide film as claimed in claim 1, further comprising a gas inlet port, in said gas supply means or in said wall of said plasma generation chamber, for supplying Ar gas thereto.

13. The apparatus for forming a silicon oxide film as claimed in claim 1, wherein said reactive gas supply means have therein gas inlet ports for supplying phosphine and diborane, respectively, to said reactive gas supply means.

14. The apparatus for forming a silicon oxide film as claimed in claim 1, further comprising heating means for heating said substrate at a temperature within the range of 150° to 300° C. at the time of film formation.

15. The apparatus for forming a silicon oxide film as claimed in claim 1, wherein said reactive gas supply means has gas ejection ports in said side wall of said plasma reaction chamber through which said reactive gas is ejected into said plasma reaction chamber, said gas ejection ports being disposed at a shortest distance of at least 5 cm from said substrate, with an ejection direction and an ejection flow rate of the gas flowing through each of said gas ejection ports being adjusted so that non-uniformity in distribution in a peripheral direction of the flow rate of gas flowing toward the center of said substrate is within 10% of the total gas flow rate.

16. The apparatus for forming a silicon oxide film as claimed in claim 9, further comprising a gas inlet port, in said gas supply means or in said wall of said plasma generation chamber, for supplying Ar gas thereto.

17. The apparatus for forming a silicon oxide film as claimed in claim 9, wherein said reactive gas supply means have therein gas inlet ports for supplying phosphine and diborane, respectively, to said reactive gas supply means.

18. The apparatus for forming a silicon oxide film as claimed in claim 9, further comprising heating means for heating said substrate at a temperature within the range of 150° to 300° C. at the time of film formation.

19. The apparatus for forming a silicon oxide film as claimed in claim 9, wherein said reactive gas supply means has gas ejection ports in said side wall of said plasma reaction chamber through which said reactive gas is ejected into said plasma reaction chamber, said gas ejection ports being disposed at a shortest distance of at least 5 cm from said substrate, with an ejection direction and an ejection flow rate of the gas flowing through each of said gas ejection ports being adjusted so that non-uniformity in distribution in a peripheral direction of the flow rate of gas flowing toward the center of said substrate is within 10% of the total gas flow rate.

20. The apparatus for forming a silicon oxide film as claimed in claim 9, further comprising an electrostatic chuck provided in said substrate holder for attracting said substrate to the substrate holding surface of said substrate holder.

21. The apparatus for forming a silicon oxide film as claimed in claim 20, further comprising a gas inlet port, in said gas supply means or in said wall of said plasma generation chamber, for supplying Ar gas thereto.

22. The apparatus for forming a silicon oxide film as claimed in claim 20, wherein said reactive gas supply means have therein gas inlet ports for supplying phosphine and diborane, respectively, to said reactive gas supply means.

23. The apparatus for forming a silicon oxide film as claimed in claim 20, further comprising heating means for heating said substrate at a temperature within the range of 150° to 300° C. at the time of film formation.

24. The apparatus for forming a silicon oxide film as claimed in claim 20, wherein said reactive gas supply means has gas ejection ports in said side wall of said plasma reaction chamber through which said reactive gas is ejected into said plasma reaction chamber, said gas ejection ports being disposed at a shortest distance of at least 5 cm from said substrate, with an ejection direction and an ejection flow rate of the gas flowing through each of said gas ejection ports being adjusted so that non-uniformity in distribution in a peripheral direction of the flow rate of gas flowing toward the center of said substrate is within 10% of the total gas flow rate.

25. The apparatus for forming a silicon oxide film as claimed in claim 1, wherein said gas control means comprises means for controlling the gas pressure in said plasma reaction chamber so that the pressure is within the range of about 29 mTorr to about 44 mTorr.

26. An apparatus for forming a silicon oxide film, comprising:

microwave generation means for generating microwaves;

microwave transmission means for transmitting the microwaves generated by said microwave generation means;

a plasma generation chamber having a wall, said plasma generation chamber being in communication with said microwave transmission means and having gas supply means and an opening defined at an end portion in opposing relationship with said microwave transmission means;

a first excitation solenoid, disposed around said plasma generation chamber in coaxial relationship therewith, for producing a magnetic field for generating plasma from gas introduced into said plasma generation chamber by the resonant effect with said microwaves;

a plasma reaction chamber for forming a silicon oxide film on a surface of a substrate disposed therein with said plasma, said plasma reaction chamber being in communication with said plasma generation chamber through said opening, and having a side wall, a substrate holder with a substrate holding surface on which the substrate is mounted, reactive gas supply means for supplying a reactive gas into said plasma reaction chamber, and gas exhaust means in communication with said plasma reaction chamber for exhausting gas in the plasma reaction chamber, said gas exhaust means having a vacuum pump;

a second excitation solenoid, disposed in opposing relationship with said first excitation solenoid relative to the substrate, for producing a magnetic field whose polarity is opposite to that of the magnetic field produced by said first excitation solenoid so as to provide a cusp-shaped magnetic field in the vicinity of said surface of said substrate;

a power supply for applying high frequency power to the substrate;

pressure control means associated with said plasma reaction chamber for controlling gas pressure in said plasma reaction chamber so that the gas pressure is within the range of $7 \times 10^{-3}$ to $1 \times 10^{-1}$ Torr; and wherein said second solenoid has an end opposing the surface of said substrate on which a silicon oxide film is to be formed, which end is disposed at a distance of 10 cm or more from the surface of said substrate on which a film is to be formed, so that said cusp-shaped magnetic field has a cusp plane in a region between a distance of 10 cm above the surface of said substrate on which a silicon oxide film is to be formed and a distance of 10 cm below the surface of said substrate on which a silicon oxide film is to be formed.

* * * * *